United States Patent
Angioni

(10) Patent No.: US 11,700,736 B2
(45) Date of Patent: Jul. 11, 2023

(54) DOPED EMISSIVE LAYER FOR PATTERNED QDS LIGHT EMITTING DIODES (QLEDS) WITH BALANCED TRANSPORT OF CHARGES

(71) Applicant: SHARP KABUSHIKI KAISHA, Sakai (JP)

(72) Inventor: Enrico Angioni, Didcot (GB)

(73) Assignee: SHARP KABUSHIKI KAISHA, Sakai (JP)

( * ) Notice: Subject to any disclaimer, the term of this patent is extended or adjusted under 35 U.S.C. 154(b) by 246 days.

(21) Appl. No.: 17/097,437

(22) Filed: Nov. 13, 2020

(65) Prior Publication Data

US 2022/0158106 A1 May 19, 2022

(51) Int. Cl.
| | |
|---|---|
| H10K 50/115 | (2023.01) |
| H10K 50/15 | (2023.01) |
| H10K 50/16 | (2023.01) |
| H10K 50/11 | (2023.01) |
| H10K 50/17 | (2023.01) |
| H10K 101/40 | (2023.01) |

(52) U.S. Cl.
CPC ........... *H10K 50/115* (2023.02); *H10K 50/11* (2023.02); *H10K 50/15* (2023.02); *H10K 50/16* (2023.02); *H10K 50/171* (2023.02); *H10K 2101/40* (2023.02)

(58) Field of Classification Search
CPC combination set(s) only.
See application file for complete search history.

(56) References Cited

U.S. PATENT DOCUMENTS

| | | | |
|---|---|---|---|
| 10,581,007 B2 | 3/2020 | Angioni et al. | |
| 2019/0305241 A1* | 10/2019 | Angioni | H01L 51/56 |
| 2020/0075877 A1* | 3/2020 | Yu | H01L 51/502 |

OTHER PUBLICATIONS

Dai et al. (2014). "Solution-processed, high-performance light-emitting diodes based on quantum dots". Nature, 515 (7525), 96-99. doi:10.1038/nature13829.

(Continued)

*Primary Examiner* — Daniel Whalen
(74) *Attorney, Agent, or Firm* — ScienBiziP, P.C.

(57) ABSTRACT

A light-emitting device includes a substrate, an anode, a cathode, an emissive layer between the anode and the cathode, the emissive layer comprising quantum dots having ligands, a cross-linked matrix comprising a cross-linkable charge transport material other than the ligands, and another charge transport material, where the quantum dots are dispersed in the cross-linked matrix, and the another charge transport material alters mobility of charge carriers of the emissive layer. The another charge transport material is not cross-linked with the cross-linked charge transport material in the cross-linked matrix. The cross-linked charge transport material is a cross-linkable hole transporting material. The another charge transporting material includes a hole transporting material. The hole transporting material has a highest occupied molecular orbital or valence energy level between those of the cross-linked hole transporting material and the quantum dots.

10 Claims, 16 Drawing Sheets

(56) References Cited

OTHER PUBLICATIONS

Tsai et al. (2019). "Solution-Processed Thermally Activated Delayed Fluorescent OLED with High EQE as 31% Using High Triplet Energy Crosslinkable Hole Transport Materials". Advanced Functional Materials, 1901025. doi:10.1002/adfm.201901025.

Zhang et al. (2018). "High-Performance, Solution-Processed, and Insulating-Layer-Free Light-Emitting Diodes Based an Colloidal Quantum Dots". Advanced Materials, 30(28), 1801387 doi:10.1002/adma.201801387.

Tang et al. (2020). "Realizing 22.3% EQE and 7-Fold Lifetime Enhancement in QLEDs via Blending Polymer TFB anti Cross-Linkable Small Molecules for a Solvent-Resistant Hole Transport Layer", doi:10.1021/acsami.0c01001.

Gaikwad et al. "Identifying orthogonal solvents for solution processed organic transistors", Organic Electronics 30 (2016) 18-29, http://dx.doi org/10.1016/j.orgel.2015. 12.008.

* cited by examiner

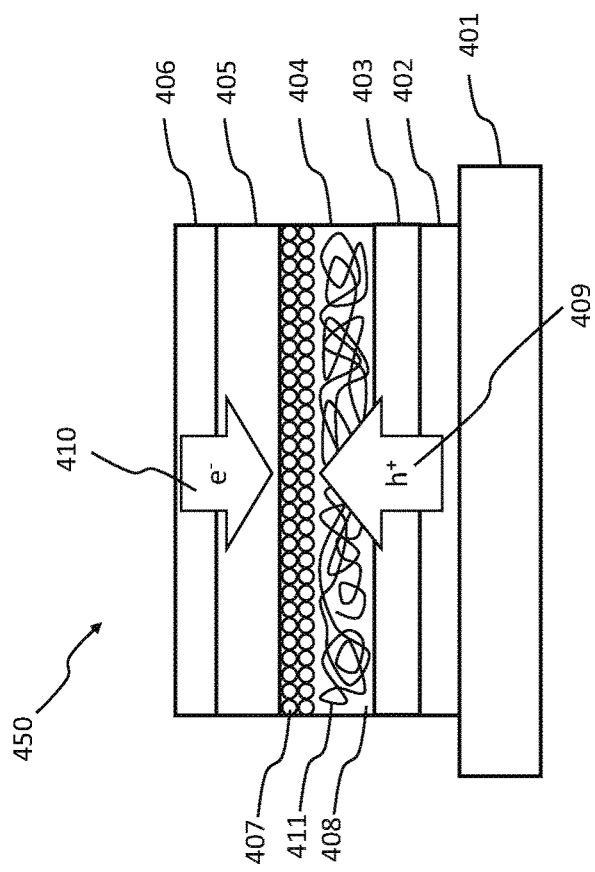
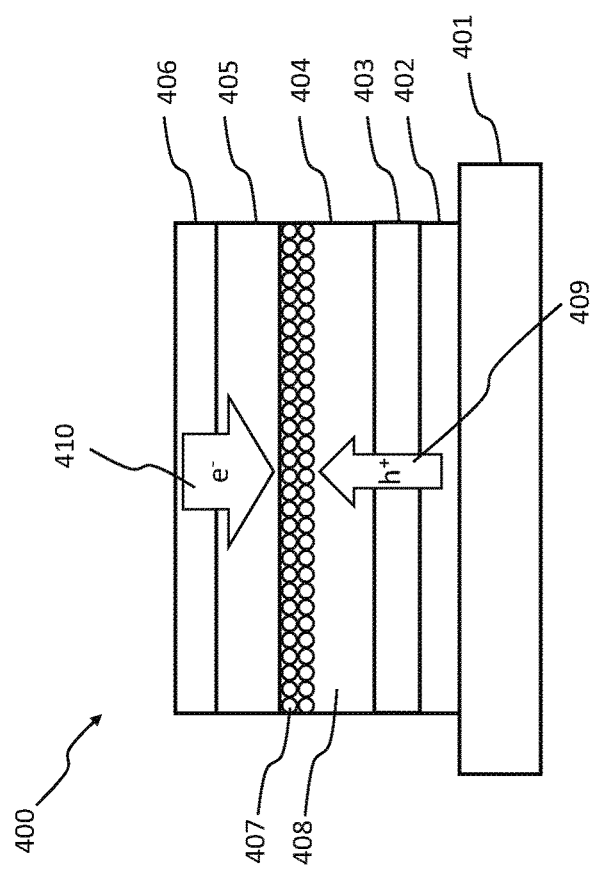
FIG. 4B
FIG. 4A
(Related Art)

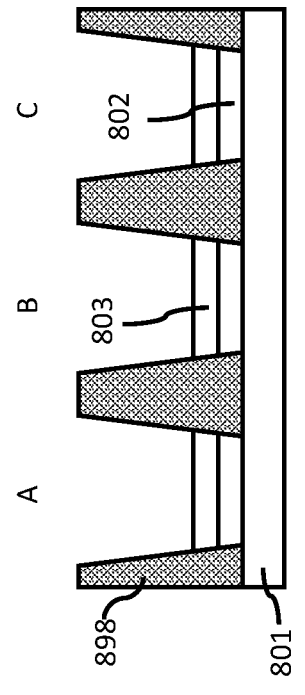
FIG. 8A
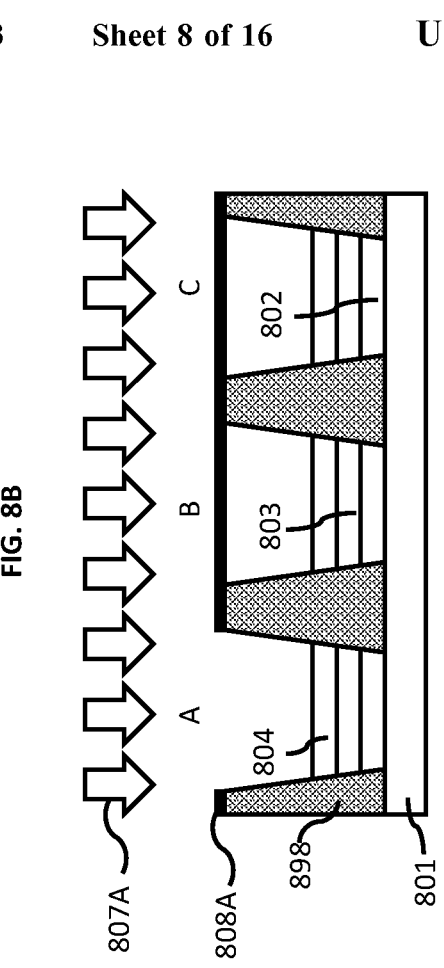
FIG. 8B
FIG. 8D
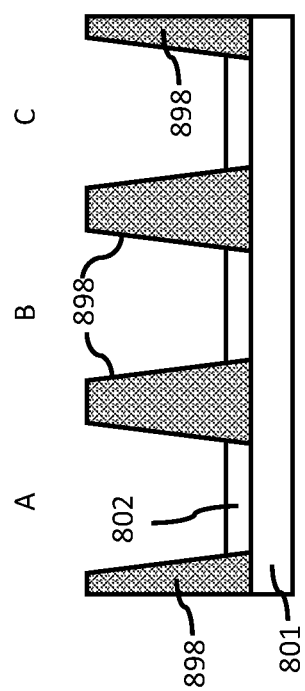
FIG. 8C

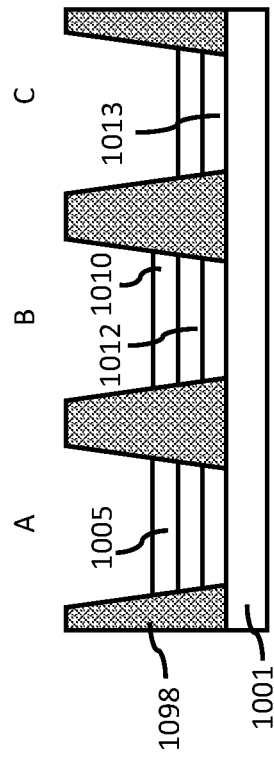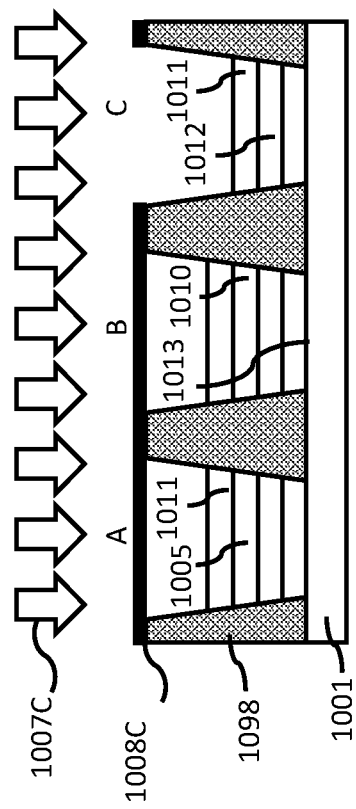
FIG. 10I
FIG. 10K
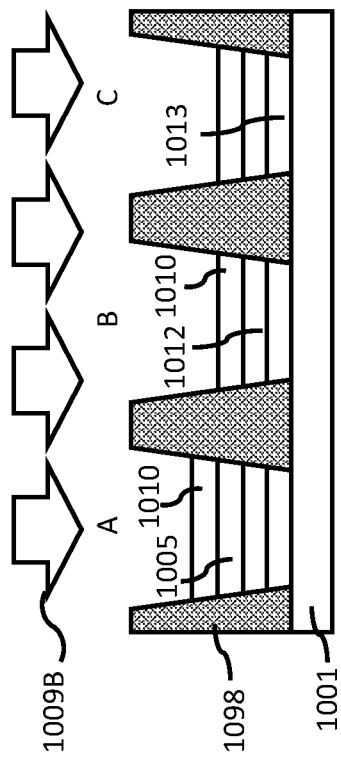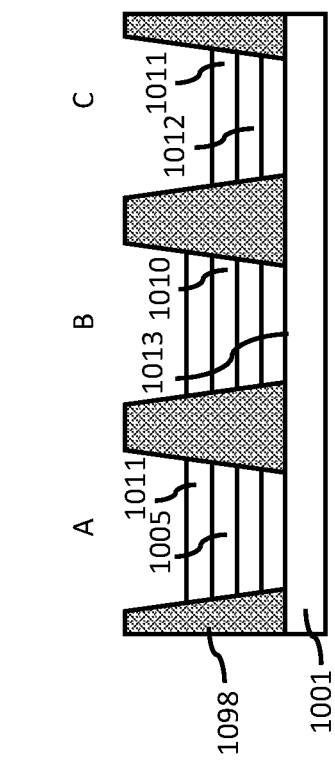
FIG. 10J
FIG. 10L

DOPED EMISSIVE LAYER FOR PATTERNED QDS LIGHT EMITTING DIODES (QLEDS) WITH BALANCED TRANSPORT OF CHARGES

FIELD

The present disclosure relates to a layer structure applicable in an emissive device, in particular for a Quantum Dot LED. Specifically, a QLED structure with balanced transport of holes and electrons for patterned light emitting devices and related manufacturing methods are provided.

BACKGROUND

A common architecture for a light-emitting device includes an anode, which functions as a hole injector; a hole transport layer disposed on the anode; an emissive material layer disposed on the hole transport layer; an electron transport layer disposed on the emissive material layer; and a cathode, which functions as an electron injector, disposed on the electron transport layer. When a forward bias is applied between the anode and cathode, holes and electrons are transported in the device through the hole transport layer and the electron transport layer, respectively. The holes and electrons recombine in the emissive material layer; light is generated and emitted from the device. When the emissive material layer includes an organic material, the light-emitting device is referred to as an organic light-emitting diode (OLED). When the emissive material layer includes nanoparticles, sometimes known as Quantum Dots (QDs), the device is commonly referred to as either a QD light-emitting diode (QLED, QD-LED) or an electroluminescent QD light-emitting diode (ELQLED, QDEL).

The above described layers are deposited on a substrate. Different structures can be achieved by changing the order of deposition of the layers. In a standard structure, the first layer deposited on the substrate is the anode, followed by the hole transporting layer, the emissive layer, the electron transporting layer and finally by the cathode. In an inverted structure, these layers are deposited on the substrate on the opposite order, starting with the cathode and finishing with the anode.

Difference methods can be utilized to deposit each of the above described layers of the light-emitting device, such as thermal evaporation methods and solution process methods. Thermal evaporation methods used for OLEDs are more complex, and have higher costs of fabrication as compared to solution process methods. Solution process methods are thus preferred as they are less complex and more cost effective.

However, in the fabrication of devices with the solution methods, finding appropriate (e.g., non-damaging) solvents is important because during the deposition of a particular layer, the process should not dissolve or otherwise damage the previously deposited layer. Such a non-damaging solvent is typically referred to as "orthogonal" to the previous layer (See Organic Electronics 30 (2016) 18e29; http://dx.doi.org/10.1016/j.orgel.2015.12.008).

To include QLEDs in multi-color high resolution displays, different manufacturing methods have been designed. These methods typically include depositing three different types of QDs on three different regions of a substrate such that each region emits light (through electrical injection; i.e., by electroluminescence) of three different colors, particularly red (R), green (G) and blue (B). Sub-pixels that respectively emit red, green, or blue light may collectively form a pixel, which in turn may be a part of an array of pixels of the display.

Angioni et al. (U.S. Pat. No. 10,581,007 B2) describes a structure for patterned QLEDs. The structure includes an anode, a cathode and an emissive layer disposed between the anode and the cathode, the emissive layer comprising QDs comprising ligands, the QDs dispersed in a crosslinked matrix formed at least partially from one or more cross-linkable charge transport materials other than the ligands. The emissive layer forms a combined charge transporting and emitting layer that can be patterned in specific areas of a substrate. The structure can be used to create multi-color high resolution displays, patterning QLED structures with three different colors, particularly red (R), green (G) and blue (B).

In general, hole mobility is usually lower than that of electron in QLEDs (DOI:10.1038/nature13829, Dai et al., Nature, 2014, 515, 96-99).

Recent studies in OLEDs (DOI: 10.1002/adfm.201901025; Tsai et al., Solution-Processed Thermally Activated Delayed Fluorescent OLED with High EQE as 31% Using High Triplet Energy Cross-linkable Hole Transport Materials. Adv. Funct. Mater., 2019, 29, 1901025) and QLEDs (DOI: 10.1002/adma.201801387; Zhang et al., High-Performance, Solution-Processed, and Insulating-Layer-Free Light-Emitting Diodes Based on Colloidal QDs, Adv Mater 2018, 30, 1801387) have indicated that double or blended hole transmission material (HTL) structures with a stepwise highest occupied molecular orbital (HOMO) energy level alignment could benefit the hole transport at interfaces in order to balance this.

In Tang et al. (DOI: 10.1021/acsami.0c01001, Realizing 22.3% EQE and 7-Fold Lifetime Enhancement in QLED: via Blending Polymer TFB and Cross-linkable Small Molecule for Solvent-Resistant Hole Transport Layer), TFB and cross-linkable small molecules are mixed and deposited together in order to create an HTL with improved hole transporting properties and solvent resistance.

CITATION LIST

Angioni et al. (U.S. Pat. No. 10,581,007 B2).
DOI:10.1038/nature13829, Dai et al., Nature, 2014, 515, 96-99).
DOI: 10.1002/adfm.201901025; Tsai et al., Solution-Processed Thermally Activated Delayed Fluorescent OLED with High EQE as 31% Using High Triplet Energy Cross-linkable Hole Transport Materials. Adv. Funct. Mater., 2019, 29, 1901025.
DOI: 10.1002/adma.201801387; Zhang et al., High-Performance, Solution-Processed, and Insulating-Layer-Free Light-Emitting Diodes Based on Colloidal QDs, Adv Mater 2018, 30, 1801387.
DOI: 10.1021/acsami.0c01001, Realizing 22.3% EQE and 7-Fold Lifetime Enhancement in QLED: via Blending Polymer TFB and Cross-linkable Small Molecule for Solvent-Resistant Hole Transport Layer.
Organic Electronics 30 (2016) 18e29; http://dx.doi.org/10.1016/j.orgel.2015.12.008).

SUMMARY

The present disclosure is related to a QLED structure with balanced transport of holes and electrons for patterned light emitting devices and related manufacturing methods.

According to a first aspect of the present disclosure, a light-emitting device includes a substrate, an anode, a cathode, and an emissive layer between the anode and the cathode, the emissive layer comprising quantum dots having ligands, a cross-linked matrix comprising a cross-linkable charge transport material other than the ligands, and another charge transport material, where the quantum dots are dispersed in the cross-linked matrix, and where the another charge transport material alters mobility of charge carriers of the emissive layer.

According to an implementation of the first aspect, the another charge transport material is not cross-linked with the cross-linked charge transport material in the cross-linked matrix.

According to another implementation of the first aspect, the cross-linked charge transport material is a cross-linkable hole transporting material; and the another charge transporting material is a hole transporting material.

According to yet another implementation of the first aspect, the hole transporting material has a highest occupied molecular orbital (HOMO) or valence energy level between those of the cross-linked hole transporting material and the quantum dots.

According to yet another implementation of the first aspect, the hole transporting material has enhanced or reduced hole transporting properties.

According to yet another implementation of the first aspect, the hole transporting material has a hole mobility higher than the cross-linked hole transporting material.

According to yet another implementation of the first aspect, the light-emitting device further includes one or more hole injecting or transporting layers between the anode and the emissive layer, and one or more electron injecting or transporting layers between the cathode and the emissive layer.

According to yet another implementation of the first aspect, the cross-linked charge transport material is a cross-linkable electron transporting material, and the another charge transporting material is an electron transporting material.

According to yet another implementation of the first aspect, the electron transporting material has a lowest unoccupied molecular orbital (LUMO) or conduction energy level between those of the cross-linked electron transporting material and the quantum dots.

According to yet another implementation of the first aspect, the electron transporting material has enhanced or reduced electron transporting properties.

According to yet another implementation of the first aspect, the light-emitting device further includes one or more electron injecting or transporting layers between the cathode and the emissive layer, and one or more hole injecting or transporting layers between the anode and the emissive layer.

According to yet another implementation of the first aspect, the cross-linked charge transport material is formed by a cross-linkable charge transport material cross-linked by an initiator, and the initiator initiates polymerization of the cross-linkable charge transport material in response to at least one of: a light stimulus; a thermal stimulus; a change in pH; and a change in pressure.

According to yet another implementation of the first aspect, the cross-linkable charge transport material is a light-induced cross-linked hole transporting material or a light-induced cross-linked electron transporting material.

According to yet another implementation of the first aspect, the another charge transport material comprises at least one of: a tertiary aromatic amine; a secondary aromatic amine; and a primary aromatic amine.

According to a second aspect of the present disclosure, a light-emitting device includes a substrate, a plurality of sub-pixel structures over the substrate. At least one of the plurality of sub-pixel structures includes: an anode, a cathode, and an emissive layer between the anode and the cathode, the emissive layer comprising quantum dots having ligands, a cross-linked matrix comprising a cross-linked charge transport material other than the ligands, and another charge transport material, where the quantum dots are dispersed in the cross-linked matrix; where the another charge transport material is not cross-linked with the cross-linked charge transport material in the cross-linked matrix, and where the another charge transport material alters mobility of charge carriers of the emissive layer.

According to an implementation of the second aspect, the cross-linked charge transport material is a cross-linkable hole transporting material, and the another charge transporting material is a hole transporting material with enhanced or reduced hole transporting properties.

According to another implementation of the second aspect, the at least one of the plurality of sub-pixel structures further comprises: one or more hole injecting or transporting layers between the anode and the emissive layer, and one or more electron injecting or transporting layers between the cathode and the emissive layer.

According to yet another implementation of the second aspect, the cross-linked charge transport material is a cross-linkable electron transporting material, and the another charge transporting material is an electron transporting material with enhanced or reduced electron transporting properties.

According to yet another implementation of the second aspect, the at least one of the plurality of sub-pixel structures further comprises: one or more electron injecting or transporting layers between the cathode and the emissive layer, and one or more hole injecting or transporting layers between the anode and the emissive layer.

BRIEF DESCRIPTION OF THE DRAWINGS

Aspects of the example disclosure are best understood from the following detailed description when read with the accompanying figures. Various features are not drawn to scale. Dimensions of various features may be arbitrarily increased or reduced for clarity of discussion.

FIG. 4A and FIG. 4B each illustrate a cross-sectional view of a QLED structure with hole and electron mobility illustrated.

FIGS. 8A, 8B, 8C, 8D, 8E, 8F, 8G, 8H, 8I, 8J, 8K, 8L, 8M, 8N, 8O and 8P are drawings depicting cross-sectional views of three patterned QLEDs according to an example fabrication method of the present disclosure.

FIGS. 10A, 10B, 10C, 10D, 10E, 10F, 10G, 10H, 10I, 10J, 10K, 10L, 10M, 10N, 10O and 10P are drawings depicting cross-sectional views of three patterned QLEDs according to an example fabrication method of the present disclosure.

DESCRIPTION

Figure 1A:
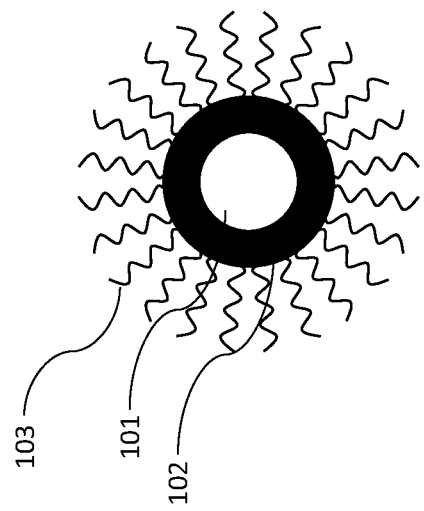
FIG. 1A is a schematic representation of a related art core-shell QD.

The following description contains specific information pertaining to exemplary implementations in the present disclosure. The drawings and their accompanying detailed description are directed to exemplary implementations. However, the present disclosure is not limited to these exemplary implementations. Other variations and implementations of the present disclosure will occur to those skilled in the art. Unless noted otherwise, like or corresponding elements in the figures may be indicated by like or corresponding reference numerals. Moreover, the drawings and illustrations are generally not to scale and are not intended to correspond to actual relative dimensions.

For consistency and ease of understanding, like features are identified (although, in some examples, not shown) by numerals in the exemplary figures. However, the features in different implementations may be different in other respects, and thus shall not be narrowly confined to what is shown in the figures.

The phrases "in one implementation," and "in some implementations," may each refer to one or more of the same or different implementations. The term "coupled" is defined as connected, whether directly or indirectly via intervening components, and is not necessarily limited to physical connections. The term "comprising" means "including, but not necessarily limited to" and specifically indicates open-ended inclusion or membership in the described combination, group, series, and equivalents. The expression "at least one of A, B and C" or "at least one of the following: A, B and C" means "only A, or only B, or only C, or any combination of A, B and C."

Additionally, any two or more of the following paragraphs, (sub)-bullets, points, actions, behaviors, terms, alternatives, examples, or claims described in the following disclosure may be combined logically, reasonably, and properly to form a specific method. Any sentence, paragraph, (sub)-bullet, point, action, behaviors, terms, or claims described in the following disclosure may be implemented independently and separately to form a specific method. Dependency, e.g., "according to", "more specifically", "preferably", "In one embodiment", "In one implementation", "In one alternative" etc., in the following disclosure refers to just one possible example which would not restrict the specific method.

For explanation and non-limitation, specific details, such as functional entities, techniques, protocols, and standards are set forth for providing an understanding of the described technology. In other examples, detailed description of well-known methods, technologies, system, and architectures are omitted so as not to obscure the description with unnecessary details.

The present disclosure is related to a specific structure of a QLED, a method to achieve it and a fabrication method to achieve multi-color high resolution displays based on QLEDs with this structure.

Figure 1B:
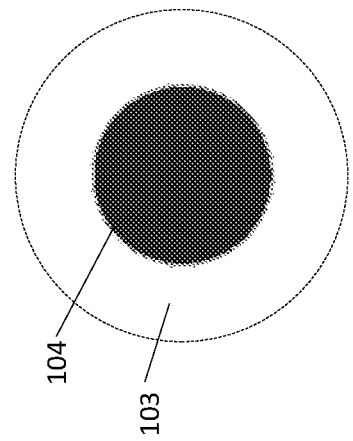
FIG. 1B is a simplified schematic representation of the related art core-shell QD in FIG. 1A.

FIGS. 1A and 1B are drawings each depicting a two-dimensional schematic representation of a related art core-shell quantum dot as may be employed in an emissive layer. QDs are defined as particles with a physical radius which is smaller than the exciton Bohr radius. The QDs may be configured as nanoparticles. A nanocrystalline core 101 is co-crystallised with a shell of a compatible material 102, which is then surrounded by ligands 103 that passivate crystal defects in the core-shell QD and allow and improve solubility in common solvents. FIG. 1B is a schematic simplified version of FIG. 1A used for more convenient representation of QDs in a light-emitting device structure, depicting a generalized core-shell QD structure 104 surrounded by a region of ligands 103.

It will be appreciated that while the present disclosure primarily describes the QDs as core-shell QDs, in some implementations the QDs may not be of the core-shell type or they may be of a core/multiple-shells type having more than one shell. The non-core-shell type QDs may be made from one or more of the above-mentioned materials, and the QDs in accordance with the present disclosure may not include a core-shell configuration.

Figure 2:
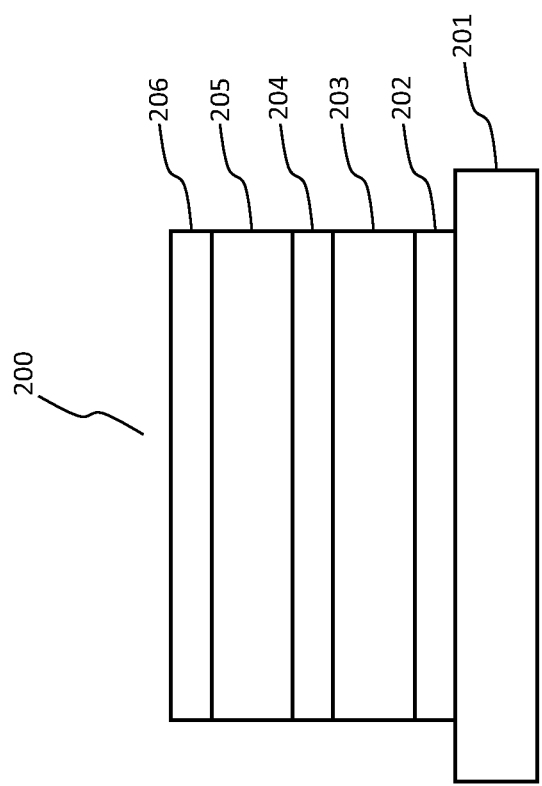
FIG. 2 illustrates a cross-sectional view of a related art quantum dot light-emitting diode (QLED).

The present disclosure may be understood with reference to FIG. 2, which illustrates the basic structure of a QLED 200. A first electrode 202 is arranged on a substrate 201, with a second electrode 206 arranged opposite the first electrode on the same side of the substrate. An emissive layer (EML) 204, which contains QDs, is arranged between the first and second electrodes and is in electrical contact with the first and second electrodes. Additional layers 203 and 205 may be present between an electrode and the EML, such as one or more charge injection layers, charge transport layers and charge blocking layers.

Figures 3A, 3B:
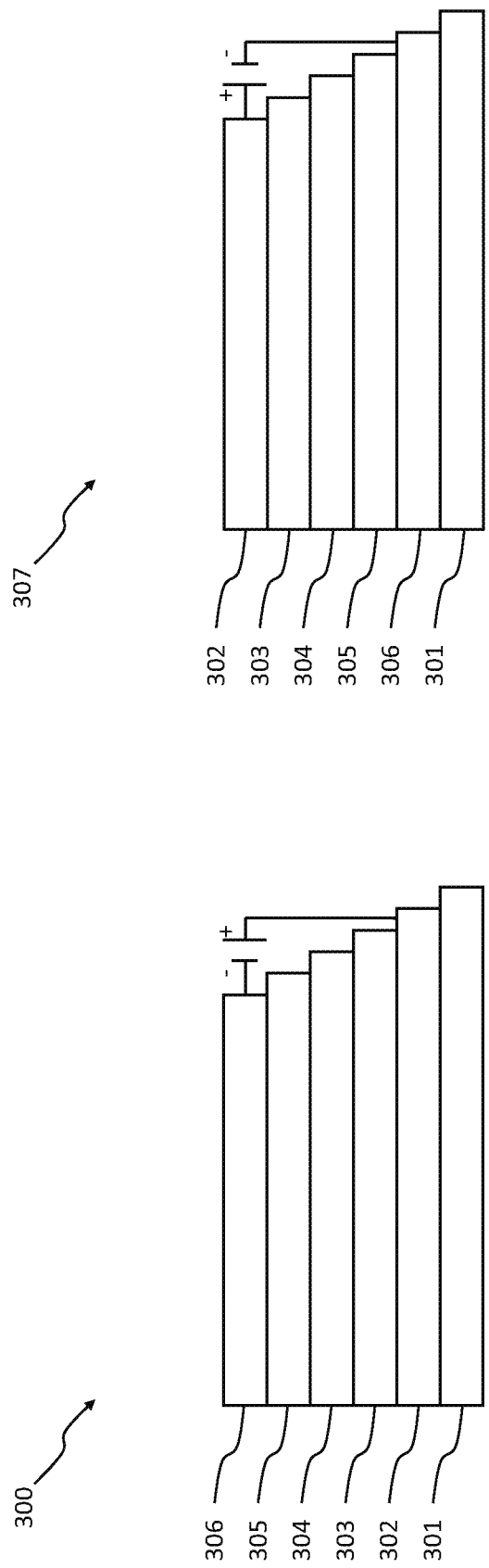
FIG. 3A illustrates a cross-sectional view of a standard QLED structure in accordance with an example implementation of the present disclosure.
FIG. 3B illustrates a cross-sectional view of an inverted QLED structure in accordance with an example implementation of the present disclosure.

In the "standard" structure 300 in FIG. 3A, the electrode closer to the substrate 301 is an anode 302, and the layer 303 between the anode 302 and the EML 304 may include one or more layers, such as hole injection layers, hole transporting layers, electron blocking layers and/or hole blocking layers. Similarly, the electrode furthest from the substrate 301 is a cathode 306, and the layer 305 between the cathode 306 and the EML 304 may include one or more layers, such as electron injection layers, electron transporting layers, hole blocking layers and/or electron blocking layers. The positions of the anode 302 and cathode 306, along with all injection, transport and blocking layers 303 and 305 may be reversed, in which case the device is said to have the "inverted" structure 307 in FIG. 3B.

When an electrical bias is applied to the QLED 300 or 307, holes are conducted from the anode 302 to the EML 304, and electrons are conducted from the cathode 306 to the EML. Holes and electrons recombine at the QDs in the EML 304, thereby generating light. Some of this light is emitted out of the QLED 300 or 307 where it may be perceived by an external viewer, thereby providing a light-emitting device. Light may be emitted through the substrate 301, in which case the device is called "bottom-emitting", or opposite the substrate, in which case the device is called "top-emitting".

In some implementations of the present disclosure, a standard structure having a patterned QLED with combined hole transporting emitting layer with enhanced hole mobility (standard structure) is disclosed.

FIG. 4A illustrates a standard bottom emitting QLED structure. The QLED structure 400 includes various layers sandwiched between two electrodes, deposited in the following order: an anode 402 deposited on a substrate 401, a hole injection layer (HIL) 403 deposited on the anode 402, a combined hole transporting and emissive layer (CHTEL) 404 deposited on the HIL 403, an electron transporting layer (ETL) 405 deposited on the CHTEL 404, and a cathode 406 deposited on the ETL 405.

The CHTEL 404 includes QDs 407, dispersed and mainly phase segregated on the top of a cross-linkable hole transport material/matrix (HTM) 408 that makes them patternable and resistant to solvent rinsing.

In the existing QLED devices, there is an imbalanced holes-to-electrons mobility due to the hole mobility being lower than the electron mobility. Furthermore, the patterned QLED devices with a combined hole transporting emitting layer have even lower hole mobility compared with a QLED structure with the emissive layer deposited from colloidal QDs because the HTM is surrounded by QDs, making the transport of charge carries even less efficient than in a pure material.

FIG. 4B illustrates a QLED structure to improve the holes-to-electrons mobility balance, in accordance with an example implementation of the present disclosure. In FIG. 4B, a QLED structure 450 includes an anode 402 deposited on a substrate 401, an HIL 403 deposited on the anode 402, a CHTEL 404 deposited on the HIL 403, an ETL 405 deposited on the CHTEL 404, and a cathode 406 deposited on the ETL 405.

The CHTEL 404 includes QDs 407, dispersed and mainly phase segregated on the top of a cross-linkable HTM 408 that makes them patternable and resistant to solvent rinsing. The CHTEL 404 also includes an efficient HTM 411 (e.g. TFB) within the cross-linkable material/QDs blend. As a result of the addition of the efficient HTM 411 in the CHTEL 404, the hole mobility 409 is improved such that the hole mobility 409 is comparable to the electron mobility, thereby bringing a correct balance of charges to the QDs, thus increasing efficiency of the light emitting device.

Figure 5A:
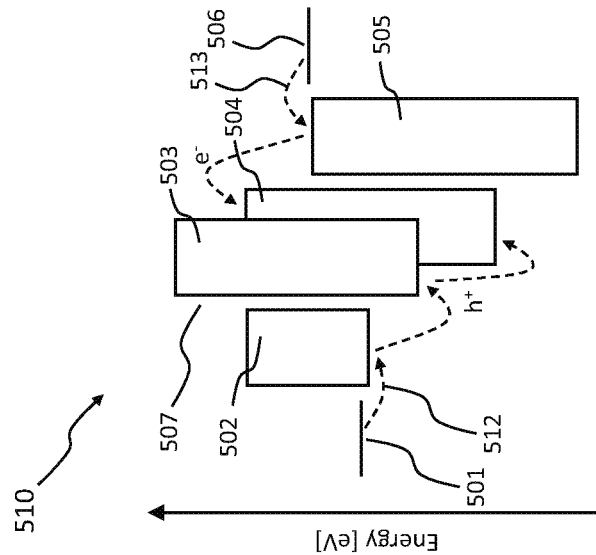
FIG. 5A and FIG. 5B are drawings depicting energy levels of QLED structures.
Figure 5B:
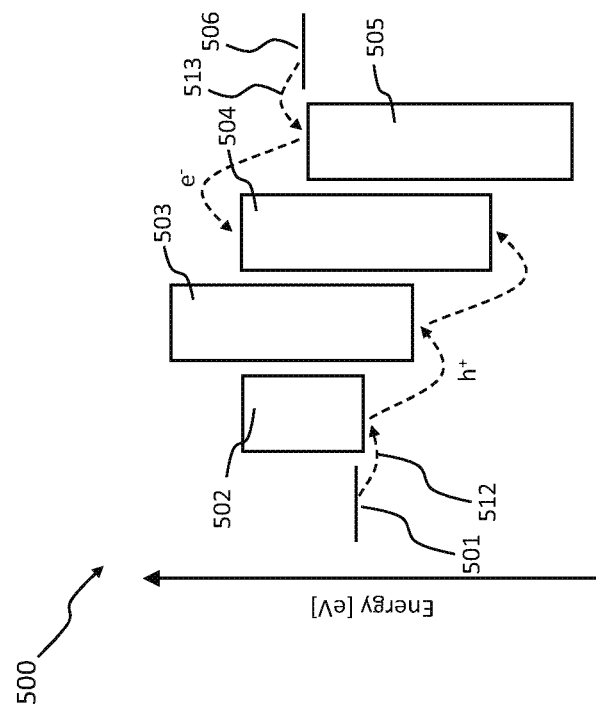

The present implementation can also be explained by considering the energy levels of the different materials that form the QLED. FIG. 5A illustrates a diagram with the energy levels for the constituents of a QLED with standard structure: anode 501, HIL 502, HTL 503, EML 504, ETL 505 and cathode 506. FIG. 5B illustrates a diagram with the energy levels for the constituents of a QLED with structure as in Angioni et al. (U.S. Pat. No. 10,581,007 B2): anode 501, HIL 502, CHTEL 507 composed of QDs 504 dispersed and mainly phase segregated on the top of a cross-linkable HTM 503, ETL 505 and cathode 506.

Figure 6:
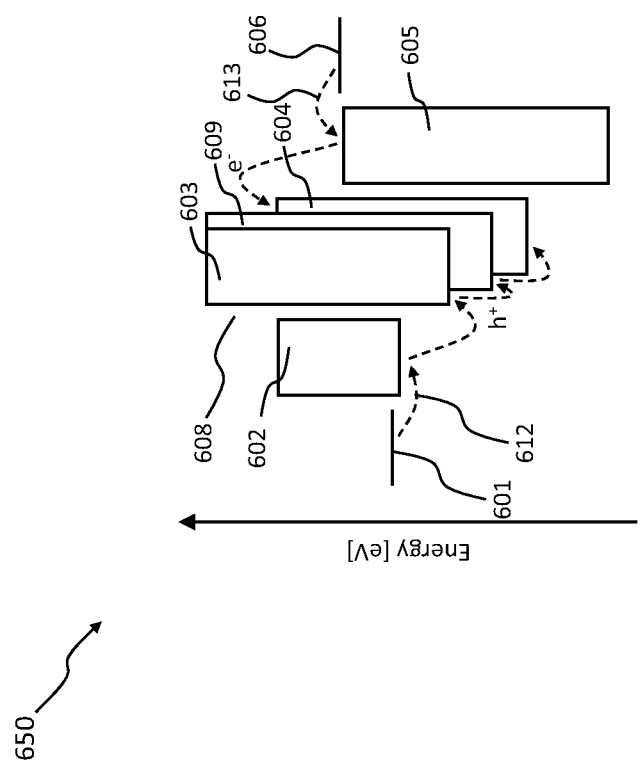
FIG. 6 is a drawing depicting energy levels of a light emitting structure according to an implementation of the present application.

FIG. 6 illustrates a diagram with the energy levels for the constituents of a QLED with structure according to implementations of the present disclosure: an anode 601, an HIL 602, a CHTEL 608 composed of QDs 604 dispersed and mainly phase segregated on the top of a mixture of a cross-linkable HTM (XHTM) 603 and hole mobility enhancer transporting material 609 (HMETM), an ETL 605 and a cathode 606.

In the QLED structures illustrated in FIGS. 5A, 5B and 6, when a positive bias is applied to the device, holes and electrons travel as illustrated by the dotted arrows and they meet at the QDs where they recombine and then emit light.

In the structure 500 illustrated in FIG. 5A, the holes and electrons have to travel passing through the different layers, encountering differences in energies and mobility from the different materials. In the structure 510 illustrated in FIG. 5B, there is an improvement for the path of the holes with the HTM 503 now cross-linked and dispersing the QDs 504, which makes these two materials more interconnected and improving the transport of holes into the QDs.

In the structure 650 illustrated in FIG. 6, there are at least two improvements for the path of the holes compared to the structure 500 in FIG. 5A. The cross-linked HTMs 603 now disperses the HMETM 609 and the QDs 604. The additional HMETM 609 has superior hole transporting mobility and potentially a valence (or HOMO if organic) energy level between one of the XHTM 603 and the one of the QDs 604. These properties introduce two benefits in the CHTEL 608: the overall hole mobility of the blend layer improves and the valence (or HOMO if organic) energy levels of the constituent materials form a latter type structure that enhances further the transport of charges.

The benefits of the structure 600 are dependent on the absolute and relative energy levels of the XHTM 603 and QDs 604. The valence (or HOMO if organic) energy levels should be in the order illustrated in FIG. 6 in order to create a latter type structure that enhances the transport of charges. The benefits of the structure 600 are also dependent on the absolute and relative hole mobility of XHTM 603 and QDs 604. The QDs 604 have higher mobility than the XHTM 603 in order to have an overall enhancement of mobility of the CHTEL 608. The benefits of the structure 650 are further dependent on the ratio between the XHTM 603 and QDs 604 in the CHTEL 608, which allows improved mobility of the overall layer, while still maintaining the possibility to create a crosslinked layer that dispersed the QDs. This aspect is of particular importance in order to include QLEDs with the structure 650 in multi-color high resolution displays.

With regard to QLED devices, three different types of QDs on three different regions of a substrate should be deposited such that each region emits light (through electrical injection; i.e. by electroluminescence) at three different colors, particularly red (R), green (G) and blue (B). Sub-pixels that respectively emit R, G, or B light may collectively form a pixel, which in turn may be a part of an array of pixels of the display.

In order to pattern different QLED structures, different QDs have to be dispersed in a crosslinked layer (this will be described in more detail below). The final layer is composed of QDs 604 (from 1 to 40 wt % of the mixture) and the plurality of charge transporting materials (from 59 to 99 wt % of the mixture). Of the charge transporting materials, the cross-linkable HTM 603 has a concentration from 20 to 99 wt % while the additional HMETM 609 has a concentration from 1 to 80 wt %.

In implementations where an initiator of the polymerisation (cross-linkage) is included, the HMETM 609 has a concentration from 0.01 wt % to 10 wt % of the final layer. The total concentration of materials in the solution used to deposit the final layer is between 0.1 to 20 wt % with the solvent being 99.9 to 80 wt % with ideal values being QDs 504 (15-20 wt %), XHTM 603 (30-750 wt %), HMETM 609 (5-30 wt %).

In implementations of the present disclosure where an initiator of the polymerisation (cross-linkage) is included, preferred values are 1-3 wt %. The preferred total concentration of materials in the solution used to deposit the final layer is between 1 to 5 wt % with the solvent being 99 to 95 wt %.

In some implementations of the present disclosure, a light emitting structure having a patterned QLED with combined hole transporting emitting layer for enhanced charge balance (standard structure) is provided. Structures according to variously implementations of the present disclosure can be applied and, if conversely, the plurality of the hole transporting layers has higher mobility than the plurality of electron transporting layers. In this implementation, adding quantities of an inefficient HTM to the layer can improve the charge balance.

In some implementations of the present disclosure, a light emitting structure having a patterned QLED with combined electron transporting emitting layer with enhanced electron mobility (inverted structure) is provided. Structures according to variously implementations of the present disclosure can be applied in inverted structures, where the QDs are mixed in an electron transporting matrix. If the electron transporting layer has low mobility, adding small quantities of an efficient electron transporting material to the layer can improve the charge balance.

Figure 7B:
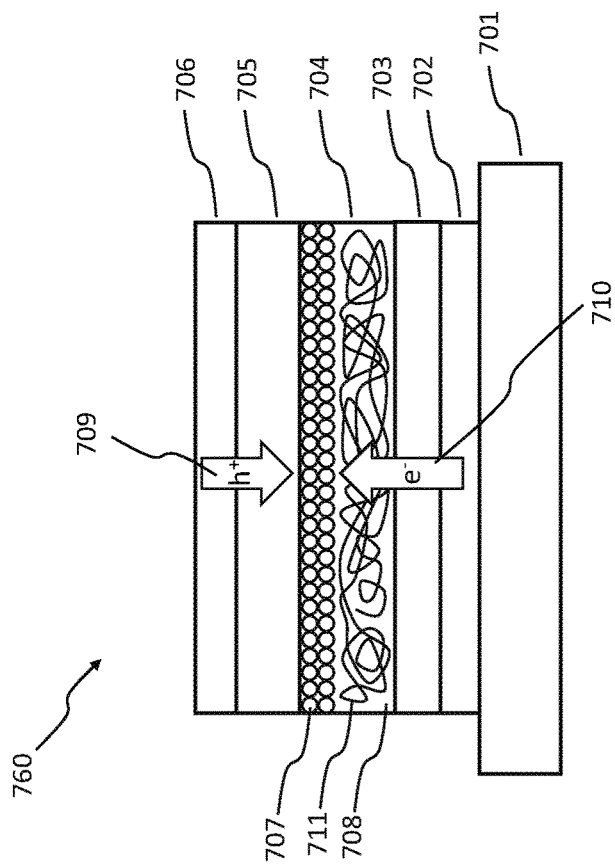
FIG. 7A and FIG. 7B are drawings depicting cross-sectional views of inverted QLED structures in accordance with implementations of the present disclosure with hole and electron mobility illustrated.
Figure 7A:
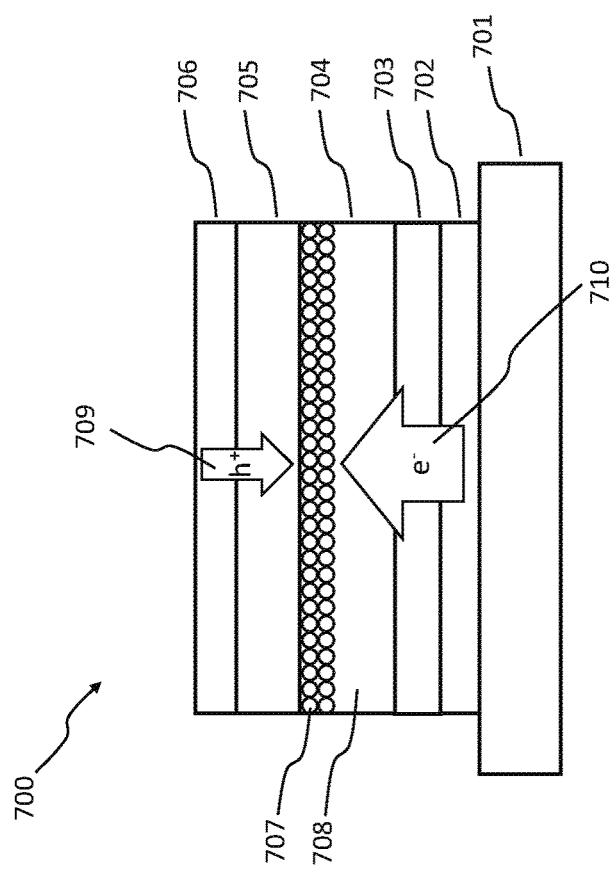

FIG. 7A illustrates an inverted QLED structure. The QLED structure 700 includes various layers sandwiched between two electrodes, deposited in the following order: a cathode 702 deposited on a substrate 701, an ETL 703 deposited on the cathode 702, a combined electron transporting and emissive layer (CETEL) 704 deposited on the ETL 703, an HIL 705 deposited on the CHTEL 704, and an anode 706 deposited on the HIL 705. The CETEL 704 includes QDs 707, dispersed and mainly phase segregated on the top of a cross-linkable electron transport material/matrix (ETM) 708 that makes them patternable and resistant to solvent rinsing. In the QLED structure 700 in FIG. 7A, there is an imbalanced holes-to-electrons mobility due to the hole mobility being lower than the electron mobility.

FIG. 7B illustrates a QLED structure to improve the holes-to-electrons mobility balance, in accordance with an example implementation of the present disclosure. In FIG. 7B, a QLED structure 760 includes a cathode 702 deposited on a substrate 701, an ETL 703 deposited on the cathode 702, a combined electron transporting and emissive layer (CETEL) 704 deposited on the ETL 703, an HIL 705 deposited on the CHTEL 704, and an anode 706 deposited on the HIL 705.

The CETEL 704 may include an inefficient ETM 711 containing insulating materials, which inhibit mobility of electrons, within the cross-linkable material/QDs blend. For example, materials that can act as insulators may include polymers such as polyethylenimine (PEI), Polyethylenimine, 80% ethoxylated (PETE), Poly(methyl methacrylate) (PMMA) and the like) and electron blocking/hole transporting materials with high energy LUMO. As a result of the addition of the inefficient ETM 711, the electron mobility 710 is reduced such that the electron mobility 710 is comparable to the hole mobility 709, thereby bringing a correct balance of charges to the QDs.

In some implementations of the present disclosure, a light emitting structure having a patterned QLED with combined electron transporting emitting layer for enhanced charge balance (inverted structure) is provided. Structures according to variously implementations of the present disclosure can be applied and, if conversely, the plurality of the electron transporting layers has higher mobility than the plurality of hole transporting layers, adding quantities of an inefficient electron transporting material to the layer can improve the charge balance.

In some implementations of the present disclosure, a light emitting structure having RGB patterned QLEDs with combined hole transporting emitting layer with enhanced hole mobility (standard structure) is provided. FIGS. 8A through 8P illustrate various cross-sectional views of three patterned QLEDs on three different regions of a substrate, in accordance with an example manufacturing method of the present disclosure. In the present implementation, there are three areas labeled A, B and C in order to distinguish three different sub-pixels. The sub-pixels respectively emit light of three different colours, and may collectively form a pixel, which in turn may be a part of an array of pixels of the display. Light-emitting devices may be arranged such that the devices are separated at least in part by one or more insulating materials. This arrangement may also be referred to as a "bank structure."

In FIG. 8A, an anode 802 is deposited on top of a substrate 801 with banks 898 shaped in order to accommodate three different sub-pixels. The anode 802 may be deposited on the substrate 801 using any suitable method. Examples include sputtering, evaporative coating, printing, chemical vapor deposition, and the like. As described above, the deposited anode 802 may be provided in any suitable form. The anode 802 may be the same in the three areas or different for each area.

In FIG. 8B, at least one hole injecting/transporting layer 803 is deposited on top of the anode 802.

In FIG. 8C, a CHTEL 804 containing QDs of type A and two HTMs, at least one cross-linkable, is deposited on top of the at least one hole injecting/transporting layer 803. The CHTEL 804 may be cross-linked (polymerised) when exposed to ultra-violet (UV) light of specific energy. The CHTEL 804 may be substantially similar to the CHTEL 404 shown in FIG. 4B, having QDs of type A, dispersed and mainly phase segregated on the top of a cross-linkable hole transporting material/matrix (HTM) that makes them patternable and resistant to solvent rinsing. The CHTEL 804 also includes an efficient HTM (e.g., TFB) within the cross-linkable material/QDs blend. As a result of the addition of the HTM in the CHTEL 804, the hole mobility is improved such that the hole mobility is comparable to the electron mobility of the final device, thereby bringing a correct balance of charges to the QDs.

In FIG. 8D, the UV cross-linkable CHTEL 804 is exposed to UV light 807A in a specific area of the substrate (e.g., area A), delimited by the use of a shadow mask 808A. A cross-linked CHTEL 804 is obtained in area A, such area A is now resistant to rinsing with a specific solvent or developer.

Figure 8E:
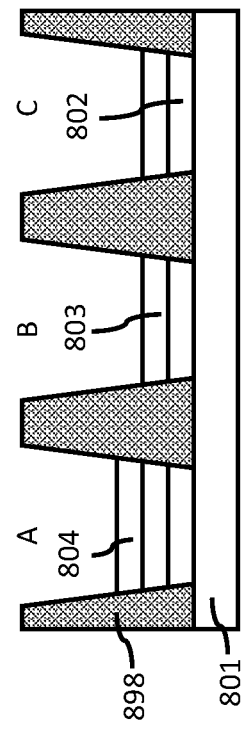

In FIG. 8E, the substrate 801 with the deposited layers 802, 803, and 804 is rinsed with a solvent or developer 809A that washes away the CHTEL 804 that is in areas B and C.

Figure 8F:
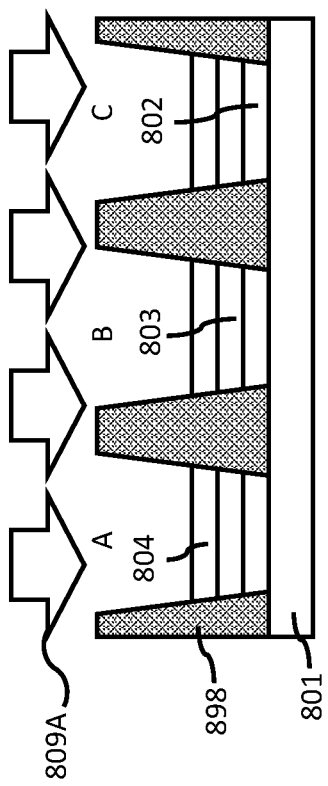

In FIG. 8F, the result is that, in area A, all layers (e.g., the anode 802, at least one hole injecting/transporting layer 803, and CHTEL 804 in area A) deposited are present, while in areas B and C, only the anode 802 and the at least one hole injecting/transporting layer 803 are present.

Figure 8G:
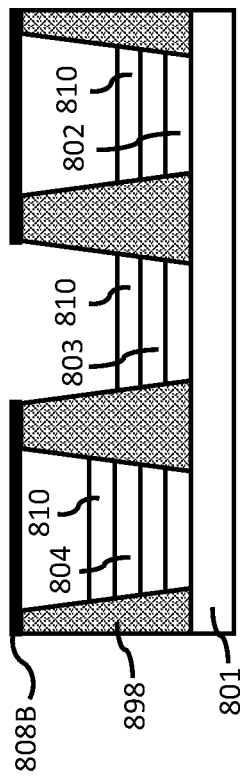

In FIG. 8G, a CHTEL 810 containing QDs of type B and two HTMs, at least one cross-linkable, is deposited. The CHTEL 810 can be cross-linked (polymerised) when exposed to UV light of specific energy. The CHTEL 810 may be substantially similar to the CHTEL 404 shown in FIG. 4B, having QDs of type B, dispersed and mainly phase segregated on the top of a cross-linkable HTM that makes them patternable and resistant to solvent rinsing. The CHTEL 810 also includes an efficient HTM (e.g., TFB) within the cross-linkable material/QDs blend. As a result of the addition of the HTM in the CHTEL 810, the hole mobility is improved such that the hole mobility is comparable to the electron mobility of the final device, thereby bringing a correct balance of charges to the QDs. It's noted that the CHTEL 810 is formed over the CHTEL 804 in area A, and over the at least one hole injecting/transporting layer 803 in areas B and C.

Figure 8H:
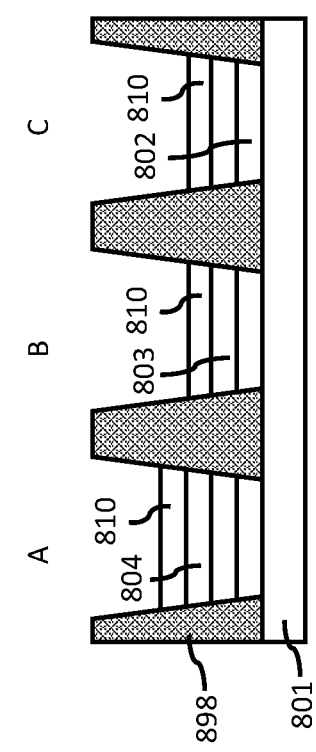

In FIG. 8H, the UV cross-linkable CHTEL 810 is exposed to UV light 807B only in a specific area of the substrate (e.g., area B), delimited by the use of a shadow mask 808B. A cross-linked CHTEL 810 is obtained in area B, such that this area is now resistant to rinsing with a specific solvent or developer.

Figure 8I:
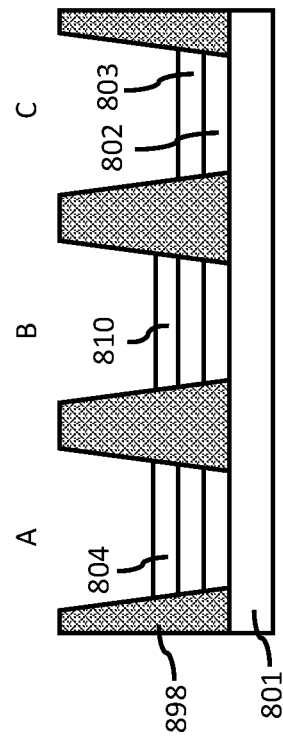

In FIG. 8I, the substrate 801 with the deposited layers is rinsed with a solvent or developer 809B that washes away the CHTEL 810 that is in areas A and C.

Figure 8J:
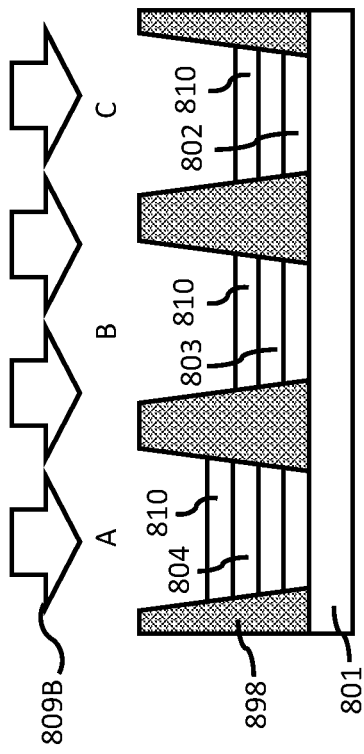

In FIG. 8J, the result is that, in area B, all layers (e.g., the anode 802, at least one hole injecting/transporting layer 803, and CHTEL 810 in area B) deposited in FIG. 8G are present, while in area A, only the layer deposited up to FIG. 8F (e.g., the anode 802, at least one hole injecting/transporting layer 803, and CHTEL 804 in area A) are present and, in area C, only the anode 802 and the at least one hole injecting/transporting layer 803 are present.

Figure 8K:
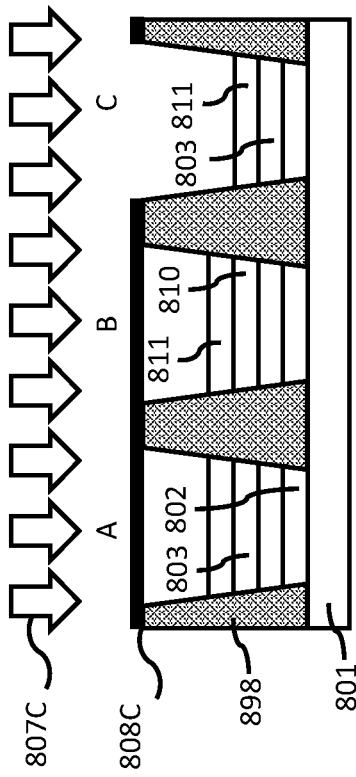

In FIG. 8K, a CHTEL 811 containing QDs of type C and two HTMs, at least one of them cross-linkable, is deposited. The CHTEL 811 may be cross-linked (polymerised) when exposed to UV light of specific energy. The CHTEL 811 may be substantially similar to the CHTEL 404 shown in FIG. 4B, having QDs of type C, dispersed and mainly phase segregated on the top of a cross-linkable HTM that makes them patternable and resistant to solvent rinsing. The CHTEL 811 also includes an efficient HTM (e.g., TFB) within the cross-linkable material/QDs blend. It's noted that the CHTEL 811 is formed over the CHTEL 804 in area A and the CHTEL 810 in area B, and over the at least one hole injecting/transporting layer 803 in area C.

Figure 8L:
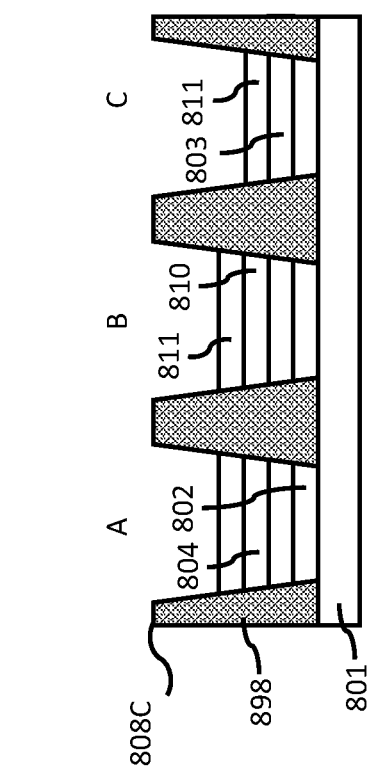

In FIG. 8L, the UV cross-linkable CHTEL 811 is exposed to UV light 807C only in a specific area of the substrate (e.g., area C), delimited by the use of a shadow mask 808C. A cross-linked CHTEL 811 is obtained in area C, such that this area is now resistant to rinsing with a specific solvent or developer.

Figure 8M:
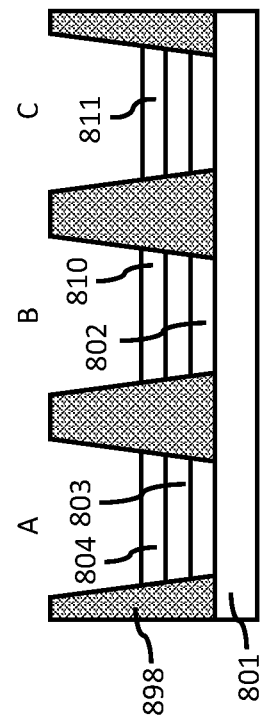

In FIG. 8M, the substrate 801 with the deposited layers is rinsed with a solvent or developer 809C that washes away the CHTEL 811 that is in areas A and B.

Figure 8N:
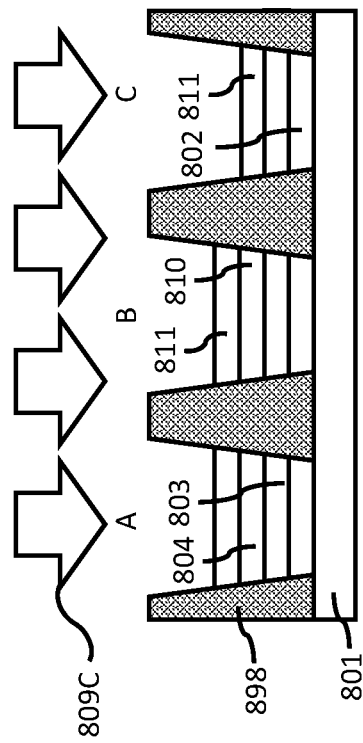

In FIG. 8N, the result is that, in area C all layers (e.g., the anode 802, at least one hole injecting/transporting layer 803, and CHTEL 811 in area C) deposited in FIG. 8K are present, while in area A, only the layers (e.g., the anode 802, at least one hole injecting/transporting layer 803, and CHTEL 804 in area A) deposited up to FIG. 8F are present, and, in area B, only the layers (e.g., the anode 802, at least one hole injecting/transporting layer 803, and CHTEL 810 in area B) deposited up to FIG. 8J are present.

Figure 8O:
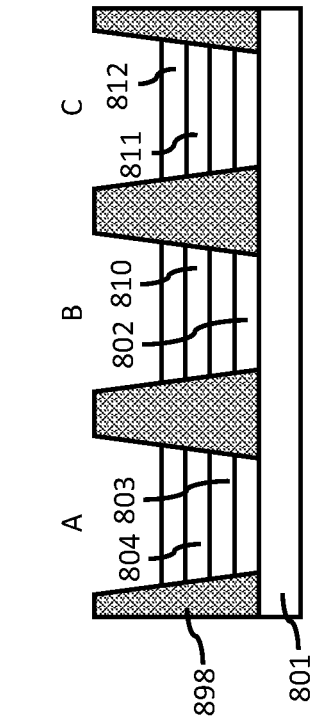
Figure 8P:
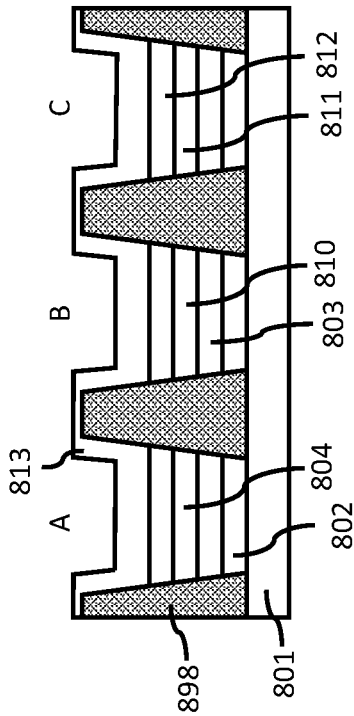

In FIG. 8O, an electron transporting layer 812 is deposited over the CHTELs 804, 810, and 811 in areas A, B, and C, respectively.

In FIG. 8P, a cathode 813 is deposited to create three QLED subpixels in areas A, B and C. The thicknesses of the layers deposited ranges from 1 to 150 nm.

Figure 9:
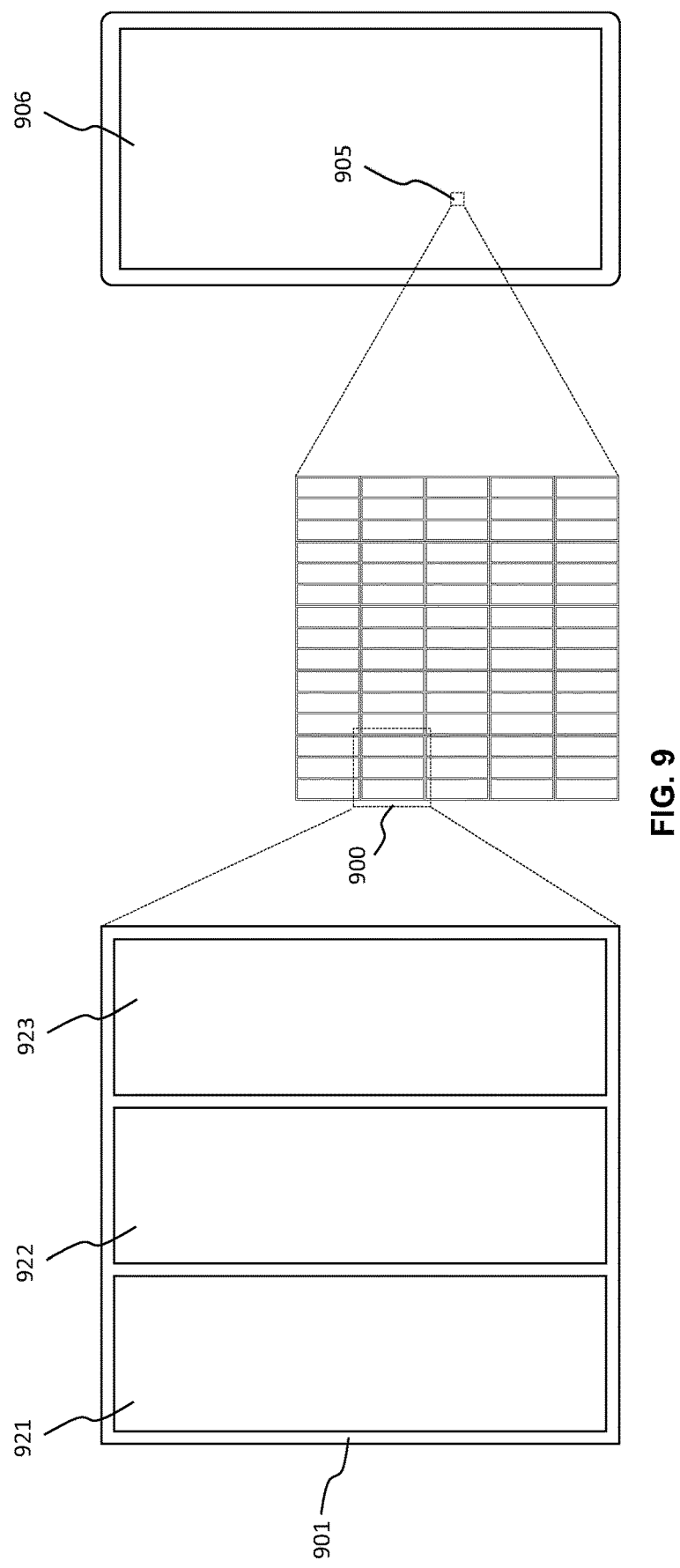
FIG. 9 is a drawing depicting a schematic diagram of three different QLEDs structures adjacent to each other as a pixel in a single substrate of a display in accordance with an implementation of the present disclosure.

FIG. 9 illustrates a schematic top view of the exemplary implementation of FIGS. 8A through 8P without the common cathode shown. It includes three different QLEDs 921, 922 and 923 with standard structure on three different regions of a substrate 901. These three QLEDs may be sub-pixels that respectively emit light of three different colours and that may collectively form a pixel 900, which in turn may be a part of an array of pixels 905 of a display 906.

In some implementations of the present disclosure, a light emitting structure having RGB patterned QLEDs with combined hole transporting emitting layer with enhanced charge mobility (standard structure) is provided. The method as illustrated in FIGS. 8A through 8P can also be used when the plurality of the hole transporting layers has higher mobility than the plurality of electron transporting layers. Adding quantities of an inefficient HTM to the layer can improve the charge balance. In this case, CHTEL 804, CHTEL 810 and CHTEL 811 each contain QDs (of type A, B or C, for CHTEL 804, CHTEL 810 and CHTEL 811, respectively) and two HTMs at least one of which is cross-linkable and the other of which contributing negatively to the hole mobility in order to improve the charge balance between electrons and holes.

In some implementations of the present disclosure, a light emitting structure having RGB patterned QLEDs with combined hole transporting emitting layer with enhanced hole mobility or enhanced charge mobility (standard structure) is provided.

Variations of the method illustrated in FIGS. 8A-8P may be used for patterning three subpixels. In some implementations, CHTEL 804, CHTEL 810 and CHTEL 811 can be of different thickness. In some implementations, the concentration ratio of the two HTMs contained in the CHTELs (e.g., CHTEL 804, CHTEL 810 and CHTEL 811) can be the same or different for each layer. In some implementations, the HTMs contained in the CHTELs (e.g., CHTEL 804, CHTEL 810 and CHTEL 811) can be different for each layer. In some implementations, the HTMs contained in the CHTELs (e.g., CHTEL 804, CHTEL 810 and CHTEL 811) can both be cross-linkable. In some implementations, the CHTELs (e.g., CHTEL 804, CHTEL 810 and CHTEL 811) can contain more than two HTMs. In some implementations, the CHTEL 804, CHTEL 810 and CHTEL 811 may or may not contain an initiator of the polymerisation, which can be different for each layer.

In some implementations of the present disclosure, a light emitting structure having a patterned QLED with combined electron transporting emitting layer with enhanced electron mobility (inverted structure) is provided.

Figure 10A:
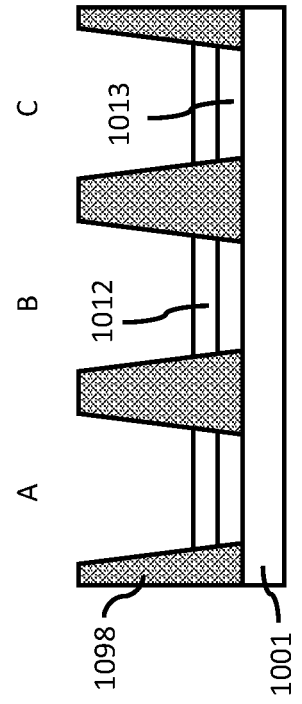
Figure 10B:
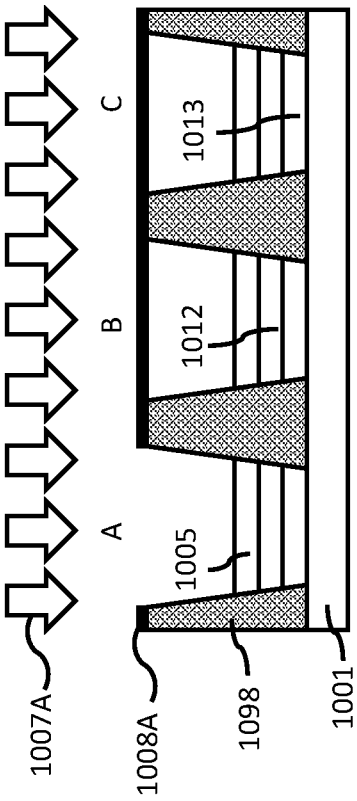
Figure 10C:
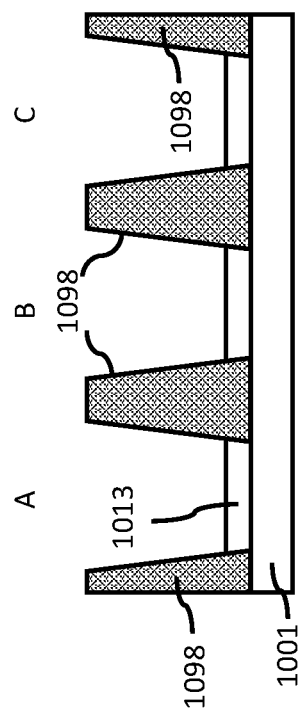
Figure 10D:
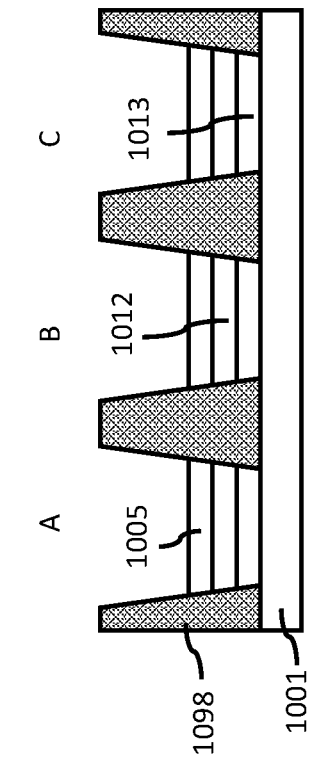
Figure 10E:
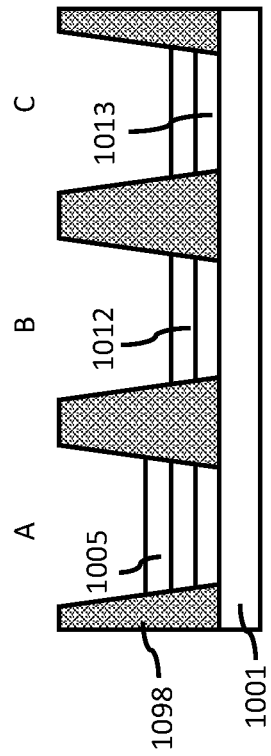
Figure 10F:
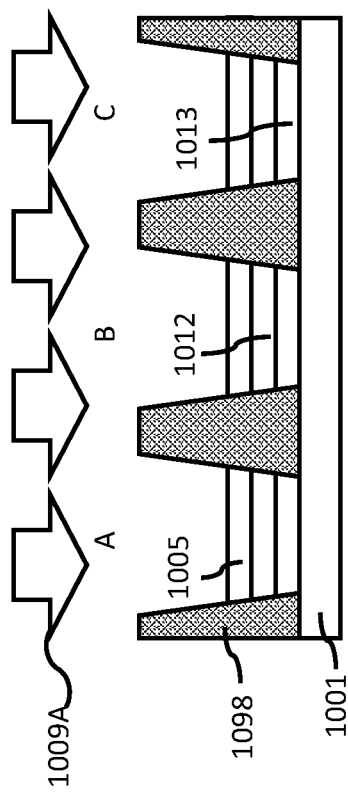
Figure 10G:
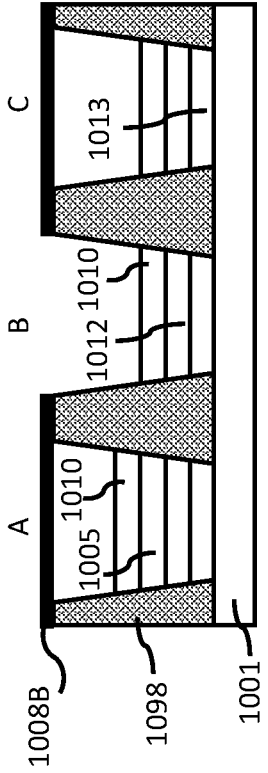
Figure 10H:
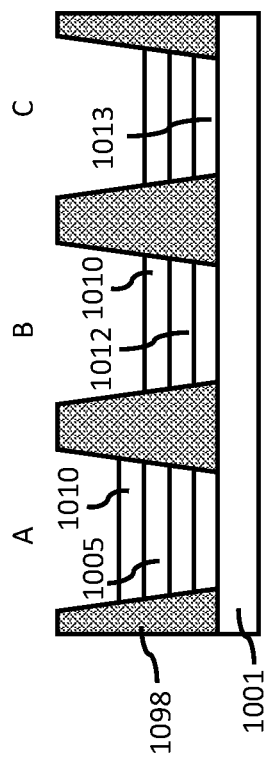
Figure 10M:
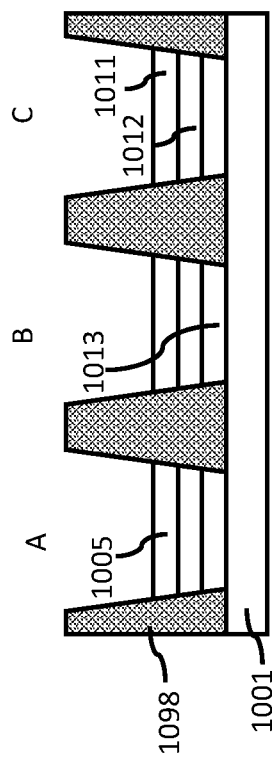
Figure 10N:
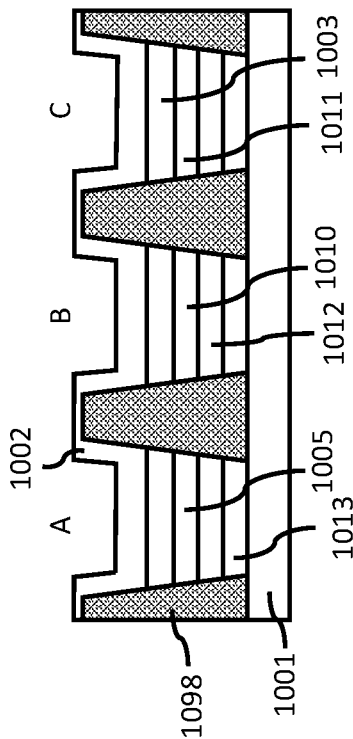
Figure 10O:
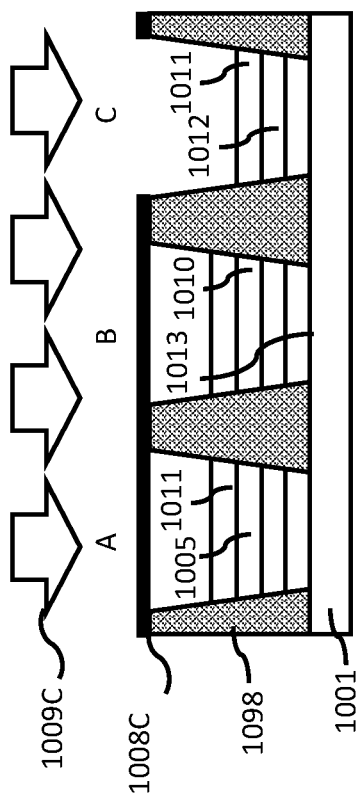
Figure 10P:
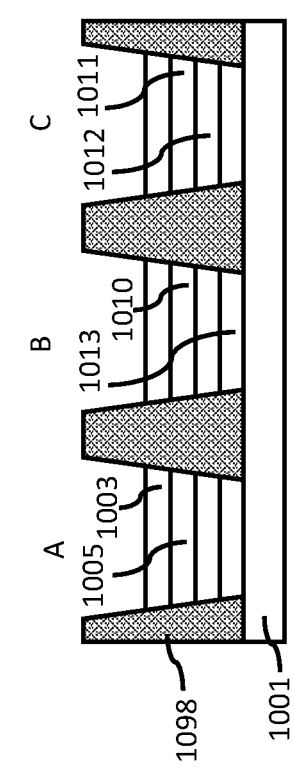

FIGS. 10A through 10P illustrate various cross-sectional views of three patterned QLEDs on three different regions of a substrate, in accordance with an example manufacturing method of the present disclosure. In the present implementation, there are three areas labeled A, B and C in order to distinguish three different sub-pixels. The sub-pixels respectively emit light of three different colours, and may collectively form a pixel, which in turn may be a part of an array of pixels of the display. Light-emitting devices may be arranged such that the devices are separated at least in part by one or more insulating materials. This arrangement may also be referred to as a "bank structure."

In FIG. 10A, a cathode 1013 is deposited on top of a substrate 1001 with banks 1098 shaped in order to accommodate three different sub-pixels. The cathode 1013 can be the same in the three areas A, B, and C, or different for each area.

In FIG. 10B, at least one electron injecting/transporting layer (EIL/ETL) 1012 is deposited on top of the anode 1013.

In FIG. 10C, a combined electron transporting emissive layer (CETEL) 1005 containing QDs of type A and two ETMs, at least one cross-linkable, is deposited on top of the EIL/ETL 1012. The CETEL 1005 may be cross-linked (polymerised) when exposed to UV light of specific energy.

In FIG. 10D, the UV cross-linkable CETEL 1005 is exposed to UV light 1007A only in a specific area of the substrate (e.g., area A), delimited by the use of a shadow mask 1008A. A cross-linked CETEL 1005 is obtained in area A, such that area A is now resistant to rinsing with a specific solvent or developer.

In FIG. 10E, the substrate 1001 with the deposited layers (e.g., layers 1013, 1012, and 1005) is rinsed with a solvent or developer 1009A that washes away the CETEL 1005 that is in areas B and C.

In FIG. 10F, the result is that, in area A all layers deposited are present, while in areas B and C, only the cathode and the electron injecting/transporting layers are present.

In FIG. 10G, a CETEL 1010 containing QDs of type B and two ETMs, at least one cross-linkable, is deposited. The CETEL 1010 can be cross-linked (polymerised) when exposed to UV light of specific energy. The CETEL 1010 may be substantially similar to the CETEL 704 shown in FIG. 7B, having QDs of type B, dispersed and mainly phase segregated on the top of a cross-linkable electron transport material/matrix (ETM) that makes them patternable and resistant to solvent rinsing. It's noted that the CETEL 1010 is formed over the CETEL 1005 in area A, and over the EIL/ETL 1012 in areas B and C.

In FIG. 10H, the UV cross-linkable CETEL 1010 is exposed to UV light 1007B only in a specific area of the substrate (e.g., area B), delimitated by the use of a shadow mask 1008B. A cross-linked CETEL 1010 is obtained in area B, such that this area is now resistant to rinsing with a specific solvent or developer.

In FIG. 10I, the substrate 1001 with the deposited layers is rinsed with a solvent or developer 1009B that washes away the CHTEL 1010 that is in areas A and C.

In FIG. 10J, the result is that, in area B, all layers deposited in FIG. 10G are present, while, in area A, only the layers deposited up to FIG. 10F are present and, in area C, only the cathode and the electron injecting/transporting layers are present.

In FIG. 10K, a CETEL 1011 containing QDs of type C and two ETMs with at least one of them cross-linkable is deposited. The CETEL 1011 can be cross-linked (polymerised) when exposed to UV light of specific energy. The CETEL 1011 may be substantially similar to the CETEL 704 shown in FIG. 7B, having QDs of type C, dispersed and mainly phase segregated on the top of a cross-linkable ETM that makes them patternable and resistant to solvent rinsing. It's noted that the CETEL 1011 is formed over the CETEL 1005 in area A and the CETEL 1010 in area B, and over the EIL/ETL 1012 in area C.

In FIG. 10L, the UV cross-linkable CETEL 1011 is exposed to UV light 1007C only in correspondence of a specific area of the substrate (e.g., area C) delimitated by the use of a shadow mask 1008C. A cross-linked CETEL C is obtained in area C, this area is now resistant to rinsing with a specific solvent or developer. A cross-linked CHTEL 1011 is obtained in area C, such that this area is now resistant to rinsing with a specific solvent or developer.

In FIG. 10M, the substrate 1001 with the deposited layers is rinsed with a solvent or developer 1009C that washes away the CETEL 1011 that is in areas A and B.

In FIG. 10N, the result is that in area C are present all layers deposited in FIG. 10K, while in area A are present only the layers deposited up to FIG. 10F and in area B are present only the layers deposited up to FIG. 10J.

In FIG. 10O, at least one hole injecting/transporting layer 1003 is deposited over the CETELs 1005, 1010, and 1011 in areas A, B, and C, respectively.

In FIG. 10P, an anode 1002 is deposited to create three QLED subpixels in the areas A, B and C. Thicknesses of layers deposited ranges from 1 to 150 nm.

In some implementations of the present disclosure, a light emitting structure having a patterned QLED with combined electron transporting emitting layer for enhanced charge balance (inverted structure) is provided. If, conversely, the plurality of the electron transporting layers has higher mobility than the plurality of hole transporting layers, adding quantities of an inefficient electron transporting material to the layer can improve the charge balance.

In some additional implementations, the solvent used for rinsing is the same solvent used in the deposition of the CHTELs. In other additional implementations, the solvent used for rinsing is a similar solvent or orthogonal solvent to the solvent used for the deposition of the CHTELs.

Accordingly, as shown in FIGS. 8F, 8J and 8N the CHTELs remain on the deposition surface. The solvent used in the CHTELs and the solvent used to wash away the remaining mixture may be evaporated during annealing (e.g., heating) of the deposited layer. The annealing may be performed at any suitable temperature that effectuates evaporation of the solvent while also maintaining the integrity of the QDs, electrodes and charge transport materials. In exemplary additional implementations, annealing may be performed at a temperature ranging from 5° C. to 150° C., at a temperature ranging from 30° C. to 150° C., or at a temperature ranging from 30° C. to 100° C.

In an exemplary additional implementation, subsequent to the application of UV light in FIGS. 8D, 8H and 8L, the layer may be annealed (e.g., heated) to facilitate evaporation and removal of the solvent(s). This annealing may be performed prior to the washing or subsequent to the washing or. In implementations in which the annealing is performed prior to the washing, a subsequent annealing may be performed after washing.

As another example, application of UV light in FIGS. 8D, 8H and 8L and annealing (e.g., heating) may be performed in parallel. This may remove the solvent used in the deposited solution. Subsequent to the rinsing, a subsequent annealing may be performed. As another example, annealing may be conducted prior to application of UV light as shown in FIGS. 8D, 8H and 8L, and subsequent to the rinsing, a subsequent annealing may be performed.

Factors such as the UV exposure times, UV-intensity, amount of photo initiator, type and thickness of the deposition surface, surface treatments (such as UV-ozone or plasma) and the ratio between cross-linkable material and the photo initiator may allow for control of the morphology of the emissive material and of the hole transporting layer. For example, UV exposure time may range from 0.001 seconds to 15 minutes, and/or UV exposure intensity may range from 0.001 to 100,000 mJ/cm$^2$. The amount of photo initiator may range from 0.001 to 15 wt % of the total concentration of the cross-linkable material in the solution. The concentration of the ligands of the QDs may range from 0 to 35 wt % of the total weight of the QDs. The thickness of the deposition surface may range from 0.1 to 1000 nm. The deposition surface may be composed of any suitable organic, metalorganic or inorganic materials.

In an exemplary implementation, the UV exposure intensity ranges from 1 to 100 mJ/cm$^2$ at a UV exposure time of 0.01 to 200 seconds, the concentration of the cross-linkable materials in the solution may range from 0.5 and 10 wt %, the photo initiator concentration ranges from 0 and 5 wt % of the concentration of the cross-linkable materials in the solution, and the thickness of the deposition surface ranges from 1 to 1000 nm.

During the fabrication of devices with the above discussed methods, it is important to find the appropriate solvents such that during the deposition of a particular layer, the process will not dissolve or otherwise damage the previously deposited layer. Such a non-damaging solvent is typically referred to in the art as "orthogonal" to the previous one (See Organic Electronics 30 (2016) 18e29; http://dx.doi.org/10.1016/j.orgel.2015.12.008).

In various implementations of the present disclosure, the solvent used for rinsing is the same solvent used in the deposition of the QDs or of the cross-linkable hole transporting material. In other implementations, the solvent used for rinsing is a similar solvent or orthogonal solvent to the solvent used deposition of the QDs or of the cross-linkable hole transporting material.

To deposit multiple layers in a typical QLED structure using solution process methods, solution of different materials in adjacent orthogonal solvents should be deposited. Solution process methods include, but are not limited to, methods of drop casting, spin coating, dip coating, slot die coating, spray coating, and inkjet printing.

In one implementation, the electron transporting material (e.g. ZnO) is dissolved and deposited in Ethanol, the emissive material (e.g. QDs) is dissolved and deposited in octane, the cross-linkable hole transporting material (e.g. OTPD) is dissolved and deposited in toluene (or in PGMEA, or in THF, or in chlorobenzene), the hole injection material (e.g. PEDOT:PSS-MoO3) is dissolved and deposited in an ethanol/2-propanol mixture.

The disclosed substrates may be made from any suitable material(s) as are typically used in light-emitting devices, such as glass substrates and polymer substrates. More specific examples of substrate materials include polyimides, polyethenes, polyethylenes, polyesters, polycarbonates, polyethersulfones, polypropylenes, and/or polyether ether ketones.

The disclosed substrates may be any suitable shape and size. In some implementations, the dimensions of the substrate allow for more than one light-emitting device to be provided thereon. In an example, a major surface of the substrate may provide an area for multiple light-emitting devices to be formed as sub-pixels of a pixel, with each sub-pixel emitting light of a different wavelength such as red, green, and blue. In another example, a major surface of the substrate may provide an area for multiple pixels to be formed thereon, each pixel including a sub-pixel arrangement of multiple light-emitting devices.

In various implementations of the present disclosure, in order to deposit various layers in a QLED structure using solution process methods, solution of different materials should be deposited in adjacent orthogonal solvents. Solution process methods include, but are not limited to, drop casting, spin coating, dip coating, slot die coating, spray coating, and inkjet printing.

In various implementations of the present disclosure, the disclosed electrodes may be made from any suitable material(s) as are typically used in light-emitting devices. At least one of the electrodes in each implementation is a transparent or semi-transparent electrode for light emission, and the other electrodes are a reflective electrode to reflect any internal light toward the light-emitting side of the device.

In bottom-emitting devices according to various implementations of the present disclosure, the first electrode may be transparent or semi-transparent. Typical materials for the transparent or semi-transparent electrode include indium-doped tin oxide (ITO), fluorine doped tin oxide (FTO) or indium-doped zinc oxide (IZO), aluminum-doped zinc-oxide (AZO), indium-doped cadmium-oxide and other similar materials.

In top-emitting devices according to various implementations of the present disclosure, the first electrode may be made of any suitable reflective metal such as silver or aluminium. In bottom-emitting devices according to various implementations of the present disclosure, the second electrode is a reflective electrode. Suitable materials used for the reflective electrode include metals such as aluminium or silver (cathodes for a conventional structure) and gold, aluminium, silver or platinum (anodes for an inverted structure). Top-emitting structures will use a semi-transparent second electrode such as thin (<20 nm) silver, a metallic bilayer (e.g., 2 nm Aluminium/15 nm Silver) or a magnesium-silver alloy.

The disclosed electrodes may also be provided in any suitable arrangement. As an example, the electrodes may address a thin-film transistor (TFT) circuit.

In various implementations of the present disclosure, materials for the disclosed QD core and shell include one or more of: InP, CdSe, CdS, $CdSe_xS_{1-x}$, CdTe, $Cd_xZn_{1-x}Se$, $Cd_xZn_{1-x}Se_yS_{1-y}$, ZnSe, ZnS, $ZnS_xTe_{1-x}$, perovskites of the form $ABX_3$, $Zn_wCu_zIn_{1-(w+z)}S$, and carbon, where 0≤w, x, y, z≤1. Materials for the disclosed ligands include alkyl, -alkenyl, -alkynyl or aryl (linear, branched or cyclic) thiols with 1 to 30 atoms of carbon; alkyl, -alkenyl, -alkynyl or aryl (linear, branched or cyclic) alcohols with 1 to 30 atoms of carbon; alkyl, -alkenyl, -alkynyl or aryl (linear, branched or cyclic) carboxylic acids with 1 to 30 atoms of carbon; tri-alkyl, -alkenyl, -alkynyl or aryl (linear, branched or cyclic) phosphine oxides with 1 to 60 atoms of carbon; alkyl, -alkenyl, -alkynyl or aryl (linear, branched or cyclic) amines with 1 to 30 atoms of carbon; salts formed from any of the above listed compounds (the anion or the cation are the binding moieties); halogen salts (the anion or the cation are the binding moieties).

It will be appreciated that while the present disclosure primarily describes the QDs as core-shell QDs, in some implementations the QDs may not be of the core-shell type or they may be of a core/multiple-shells type having more than one shell. The non-core-shell type QDs may be made from one or more of the above-mentioned materials, and the QDs in accordance with the present disclosure may not include a core-shell configuration.

In various implementations of the present disclosure, the solvent or developer may be any suitable solvent, mixture or solution. For example, the solvent may be selected such that the QDs, the cross-linkable material when not polymerised (and the photo initiator, if included) are soluble therein.

In various implementations of the present disclosure, example solvents include, but are not limited to, the following (or mixtures including the following): acetone, dichloromethane, chloroform, linear or branched alkyl acetates (e.g. ethyl acetate, n-butyl acetate, 2-butyl acetate), linear or branched alkanes with 3 to 30 atoms of carbon (e.g., pentane, hexane, heptane, octane, nonane, decane, undecane, dodecane), linear or branched alcohols with 1 to 20 atoms of carbon (e.g., butanol, 2-propanol, propanol, ethanol, methanol), linear or branched alkoxy alcohols with 2 to 20 atoms of carbon (e.g., 2-Methoxyethanol, 2-Ethoxyethanol), mono, di and tri halogen substituted benzenes (e.g., chlorobenzene, 1,2-dibromobenzene, 1,3-dibromobenzene, 1,4-dibromobenzene, 1,3,5-tribromobenzene, 1,2,4-tribromobenzene), linear or branched ethers with 2 to 20 atoms of carbon, and/or mono, di and tri alkyl substituted benzenes (e.g., toluene, 1,2-Dimethylbenzene, 1,3-Dimethylbenzene, 1,4-Dimethylbenzene), benzene, dioxane, propylene glycol monomethyl ether acetate (PGMEA), 1-methoxy-2-propanol, water.

In various implementations of the present disclosure, example solutions may include any alkaline or acidic material in one or in a mixture of the previously disclosed solvents. The particular solvent or developer that is utilized may depend on the specific QDs, cross-linkable material, and photo initiator that are selected.

In various implementations of the present disclosure, example insulating materials for the disclosed banks may include, but are not limited to, polyimides. In some examples, the insulating material may include a surface treatment, such as fluorine, to modify the insulating material wetting properties.

For example, the insulating material may be made hydrophilic to prevent the deposited material from sticking on the banks and to ensure the subpixel is filled properly. The insulating material thus forms wells and the bottoms may include different electrodes (e.g., anodes) for each subpixel.

In various implementations of the present disclosure, the cross-linked hole transporting layer is formed using one or more photo-initiators. As such, the disclosed layers may include one or more photo-initiators. A photo initiator is a material that initiates polymerization in response to light stimuli. In some implementations, the photo initiator may generate one or more radicals, ions, acids, and/or species that may initiate such polymerization.

In various implementations of the present disclosure, the initiator is a photo initiator. Example photo initiators include sulfonium- and iodonium-salts (e.g. triphenylsulfonium triflate, diphenyliodonium triflate, iodonium, [4-(octyloxy) phenyl]phenyl hexafluorophosphate, bis(4-methylphenyl) iodonium hexafluorophosphate, diphenyliodonium hexafluoroarsenate, diphenyliodonium hexafluoroantimonate, etc), chromophores containing the benzoyl group (benzoin ether derivatives, halogenated ketones, dialkoxyacetophenones, diphenylacetophenones, etc), hydroxy alkyl heterocyclic or conjugated ketones, benzophenone- and thioxanthone-moiety-based cleavable systems (such as benzophenone phenyl sulfides, ketosulfoxides, etc), benzoyl phosphine oxide derivatives, phosphine oxide derivatives, trichloromethyl triazines, biradical-generating ketones, peroxides, diketones, azides and aromatic bis-azides, azo derivatives, disulfide derivatives, disilane derivatives, diselenide and diphenylditelluride derivatives, digermane and distannane derivatives, peresters, barton's ester derivatives, hydroxamic and thiohydroxamic acids and esters, organoborates, titanocenes, chromium complexes, aluminate complexes, tempo-based alkoxyamines, oxyamines, alkoxyamines, and silyloxyamines.

In various implementations of the present disclosure, when the specific area of the deposited layer is exposed to UV light, the photo initiator initiates the polymerization of the cross-linkable material. QDs, ligands of the QDs, cross-linkable material, charge transporting material, and a photo-initiator can be selected to create uniform dispersion in the deposition solvent. Materials with similar polarity indexes can be selected to ensure homogeneity of the deposited mixtures.

In various implementations of the present disclosure, the electron transport and/or electron injection layers may include individual or combinations of: ZnO, 8-quinolinolato lithium (Liq.), LiF, $Cs_2CO_3$, $Mg_xZn_{1-x}O$, $Al_xZn_{1-x}O$, $Ga_xZn_{1-x}O$, 2,2',2"-(1,3,5-benzinetriyl)-tris(1-phenyl-1-H-benzimidazole) (TPBi), $TiO2$, $ZrO2$, N4,N4'-Di(naphthalen-1-yl)-N4,N4'-bis(4-vinylphenyl)biphenyl-4,4'-diamine (VNPB), 9,9-Bis[4-[((4-ethenylphenyl)methoxy]phenyl]-N2,N7-di-1-naphthalenyl-N2,N7-diphenyl-9H-Fluorene-2,7-diamine (VB-FNPD), where $0 \leq x \leq 1$.

In various implementations of the present disclosure, the hole transport and/or hole injection layers may include individual or combinations of: poly(3,4-ethylenedioxythiophene):poly(styrenesulfonate) (PEDOT:PSS), poly(9,9-dioctylfluorene-co-N-(4-sec-butylphenyl)-diphenyl amine) (TFB), poly(9-vinylcarbazole) (PVK), poly(N,N'-bis(4-butylphenyl)-N,N'-bisphenylbenzidine) (PolyTPD), $V_2O_5$, NiO, CuO, $WO_3$, $MoO_3$, 2,3,5,6-tetrafluoro-7,7,8,8-tetracyanoquinodimethane (F4TCNQ), 1,4,5,8,9,11-hexaazatriphenylenehexacarbonitrile (HATCN), N4,N4'-Bis(4-(6-((3-ethyloxetan-3-yl)methoxy)hexyl)phenyl)-N4,N4'-diphenylbiphenyl-4,4'-diamine (OTPD), N4,N4'-Bis(4-(6-((3-ethyl oxetan-3-yl)methoxy)hexyloxy)phenyl)-N4,N4'-bis(4-methoxyphenyl)biphenyl-4,4'-diamine (QUPD), N,N'-(4,4'-(Cyclohexane-1,1-diyl)bis(4,1-phenyl ene))bis(N-(4-(6-(2-ethyloxetan-2-yloxy)hexyl)phenyl)-3,4,5-trifluoroaniline) (X-F6-TAPC), 3,5-di-9H-carbazol-9-yl-N,N-bis[4-[[6-[(3-ethyl-3-oxetanyl)methoxy]hexyl]oxy] phenyl]-benzenamine (Oxe-DCDPA).

In various implementations of the present disclosure, the disclosed cross-linked materials are originated from the polymerisation of a cross-linkable organic (or organo-metallic) material. UV-induced crosslinked charge transport materials include UV-induced crosslinked hole transporting materials and/or UV-induced crosslinked electron transporting materials. Accordingly, the matrix of one or more UV-induced crosslinked charge transporting materials may be formed from one or more types of cross-linkable materials. Such materials include one or more hole transporting materials and/or one or more electron transporting materials.

In various implementations of the present disclosure, the cross-linkable hole transport material may be a material which is an effective hole transporter both without and with crosslinking. In other implementations, the cross-linkable hole transport material may be a material which is an effective hole transporter only when crosslinked.

In various implementations of the present disclosure, the cross-linkable electron transporting material may be a material which is an effective electron transporter both without and with crosslinking. In other implementations, the cross-linkable electron transporting material may be a material which is an effective electron transporter only when crosslinked. In some implementations, the cross-linked charge transport materials can include one or more of hole injecting materials, electron injecting materials, hole blocking materials, electron blocking materials, and/or interconnecting materials (ICM).

In various implementations of the present disclosure, the cross-linkable material from which the UV-induced cross-linked charge transport material may be formed includes at least two moieties with different characteristics. As an example, one of the at least two moieties of the molecule may provide charge transporting properties and another of the at least two moieties of the molecule may provide UV-cross-linking capabilities. Exemplary moieties that may provide charge transporting properties include, but are not limited to, tertiary, secondary, and primary aromatic or aliphatic amines, heterocyclic amines, tryaryl phosphines, and quinolinolates. Exemplary moieties that may provide UV-cross-linking capabilities include, but are not limited to, oxetane, epoxy, thiol, alkane, alkene, alkyne, azide, ketone, and aldehyde units. In some implementations, the two moieties may be connected and there may be a distance of less than 20 nm between them.

In various implementations of the present disclosure, the mixture of the cross-linkable material with the QDs may include a small molecule co-monomer that allows polymerization. The co-monomer may contain at least one functional group X that may interact with a functional group Y of the cross-linkable material. The cross-linkable material may include such functional group Y at two or more molecular sites.

For example, the functional group X may be at two ends of the co-monomer; the functional groups Y may be at two ends of the cross-linkable material. In one implementation, the functional group X may be a thiol, and the function group Y may be an alkane or alkene or alkyne, or vice versa.

Ligands of the QDs, co-monomers and cross-linkable materials included in the mixture can be selected to create uniform dispersion in the deposition solvent. Materials with similar polarity indexes can be selected to ensure homogeneity of the deposited mixtures.

One example of a cross-linkable material from which the prior disclosed structure may be formed is N4,N4'-Bis(4-(6-((3-ethyloxetan-3-yl)methoxy)hexyl)phenyl)-N4,N4'-diphenylbiphenyl-4,4'-diamine (OTPD), shown in Formula 1.

Formula 1

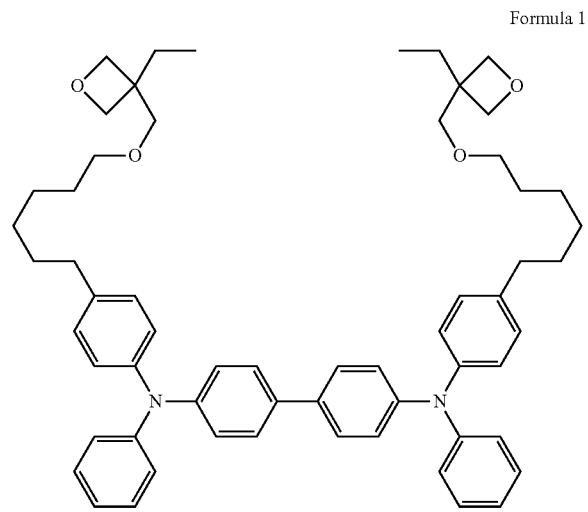 [SMILES: CCC1(COCCCCCCc2ccc(N(c3ccccc3)c3ccc(-c4ccc(N(c5ccccc5)c5ccc(CCCCCCOCC6(CC)COC6)cc5)cc4)cc3)cc2)COC1]

Another example of a cross-linkable material from which the prior disclosed structure may be formed is N4,N4'-Bis(4-(6-((3-ethyloxetan-3-yl)methoxy)hexyloxy)phenyl)-N4,N4'-bis(4-methoxyphenyl)biphenyl-4,4'-diamine (QUPD), shown in Formula 2.

Formula 2

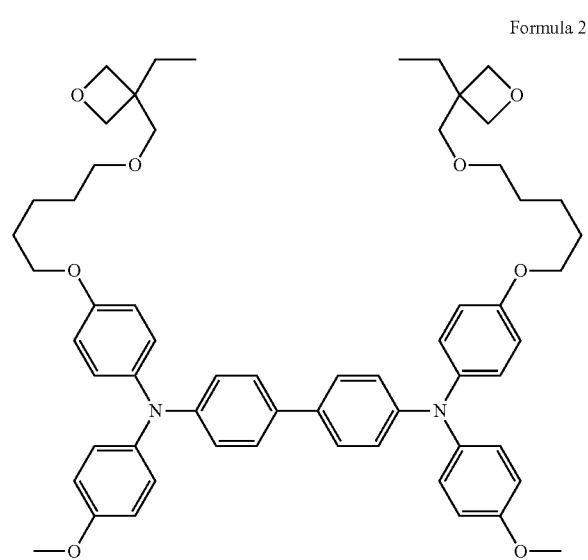 [SMILES: CCC1(COCCCCCOc2ccc(N(c3ccc(OC)cc3)c3ccc(-c4ccc(N(c5ccc(OC)cc5)c5ccc(OCCCCCOCC6(CC)COC6)cc5)cc4)cc3)cc2)COC1]

Another example of a cross-linkable material from which the prior disclosed structure may be formed is N,N'-(4,4'-(Cyclohexane-1,1-diyl)bis(4,1-phenylene))bis(N-(4-(6-(2-ethyl oxetan-2-yloxy)hexyl)phenyl)-3,4,5-trifluoroaniline) (X-F6-TAPC), shown in Formula 3.

Formula 3

Another example of a cross-linkable from which the prior disclosed structure may be formed is N4,N4'-Di(naphthalen-1-yl)-N4,N4'-bis(4-vinylphenyl)biphenyl-4,4'-diamine (VNPB), shown in Formula 4.

Formula 4

Another example of a cross-linkable material from which the prior disclosed structure may be formed is 9,9-Bis[4-[(4-ethenylphenyl)methoxy]phenyl]-N2,N7-di-1-naphthalenyl-N2,N7-diphenyl-9H-Fluorene-2,7-diamine (VB-FNPD), shown in Formula 5.

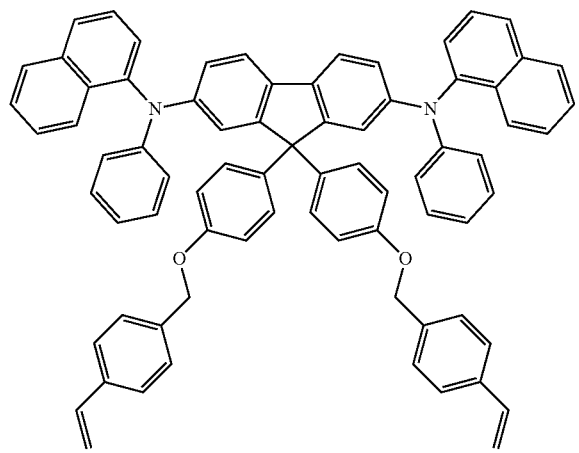

Formula 5

Another example of a cross-linkable material from which the prior disclosed structure may be formed is 3,5-di-9H-carbazol-9-yl-N,N-bis[4-[ [6-[(3-ethyl-3-oxetanyl)methoxy]hexyl]oxy]phenyl]-benzenamine (Oxe-DCDPA), shown in Formula 6.

optical mode of the cavity and, therefore, can have a significant effect on the properties of the light emitted through the second electrode.

For example, such parameters can affect the efficiency of light escaping from the light emitting device, and the dependence of intensity and wavelength on emission direction. Therefore, it is often preferable to select the thickness of layers disposed between the QDs and the electrodes to provide a favorable optical cavity for optimal light efficiency. Suitable thicknesses are different for different wavelengths of light (e.g. different between a device emitting red light and a device emitting green light).

It is evident that various techniques can be utilized for implementing the concepts of the present disclosure without departing from the scope of those concepts. Moreover, while the concepts have been described with specific reference to certain implementations, a person of ordinary skill in the art would recognize that changes can be made in form and detail without departing from the scope of those concepts. As such, the disclosure is to be considered in all respects as illustrative and not restrictive. It should also be understood that the present disclosure is not limited to the particular described implementations, but that many rearrangements, modifications, and substitutions are possible without departing from the scope of the present disclosure.

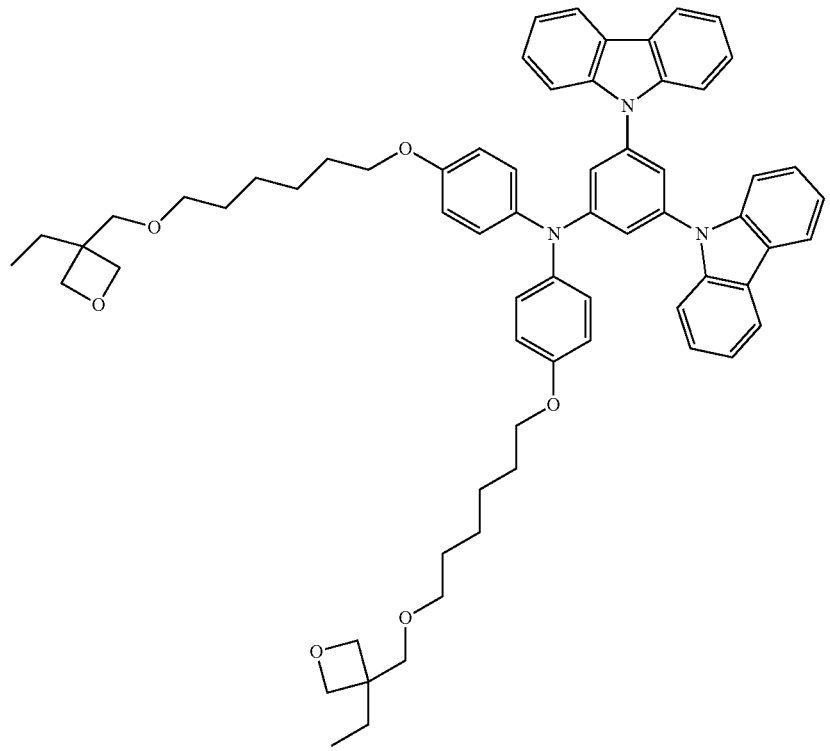

Formula 6

In various implementations of the present disclosure, for top-emitting devices that include reflective electrodes (e.g. the first electrodes) and partially reflective electrodes (e.g. the second electrode), an optical cavity can be established for the light emitted from QDs by electroluminescence. The distance between the QDs emitting light and the first electrode, and the distance between the QDs emitting light and the second electrode, can have a significant effect on the

What is claimed is:

1. A light-emitting device, comprising:
   a substrate;
   an anode;
   a cathode; and
   an emissive layer between the anode and the cathode, the emissive layer comprising quantum dots having ligands, a cross-linked matrix comprising a crosslinkable charge transport material other than the ligands, and another charge transport material,
wherein:
the quantum dots are dispersed in the cross-linked matrix,
the another charge transport material alters mobility of charge carriers of the emissive layer,
the cross-linkable charge transport material is a cross-linkable hole transporting material,
the another charge transport material is an efficient hole transporting material that improves hole mobility more than the cross-linkable charge transport material, and
in the emissive layer, the quantum dots and the another charge transport material are layer-separated from each other such that the quantum dots are close to the cathode and the another charge transport material is close to the anode.

2. The light-emitting device of claim 1, wherein the efficient hole transporting material has a highest occupied molecular orbital (HOMO) or valence energy level between those of the cross-linkable hole transporting material and the quantum dots.

3. The light-emitting device of claim 1, wherein the efficient hole transporting material has enhanced or reduced hole transporting properties.

4. The light-emitting device of claim 1, wherein the efficient hole transporting material has a hole mobility higher than the cross-linkable hole transporting material.

5. The light-emitting device of claim 1, further comprising:
one or more hole injecting or transporting layers between the anode and the emissive layer; and
one or more electron injecting or transporting layers between the cathode and the emissive layer.

6. A light-emitting device, comprising:
a substrate;
an anode;
a cathode; and
an emissive layer between the anode and the cathode, the emissive layer comprising quantum dots having ligands, a cross-linked matrix comprising a cross-linkable charge transport material other than the ligands, and another charge transport material,
wherein:
the quantum dots are dispersed in the cross-linked matrix;
the another charge transport material alters mobility of charge carriers of the emissive layer,
the cross-linkable charge transport material is a cross-linkable electron transporting material,
the another charge transport material is an inefficient electron transporting material that inhibits mobility of electrons more than the cross-linkable charge transport material, and
in the emissive layer, the quantum dots and the another charge transport material are layer-separated from each other such that the quantum dots are close to the anode and the another charge transport material is close to the cathode.

7. The light-emitting device of claim 6, wherein the inefficient electron transporting material has a lowest unoccupied molecular orbital (LUMO) or conduction energy level between those of the cross-linkable electron transporting material and the quantum dots.

8. The light-emitting device of claim 6, wherein the inefficient electron transporting material has enhanced or reduced electron transporting properties.

9. The light-emitting device of claim 6, further comprising:
one or more electron injecting or transporting layers between the cathode and the emissive layer; and
one or more hole injecting or transporting layers between the anode and the emissive layer.

10. A light emitting structure, comprising:
a substrate; and
a plurality of sub-pixel structures over the substrate,
wherein at least one of the plurality of sub-pixel structures includes:
an anode;
a cathode; and
an emissive layer between the anode and the cathode, the emissive layer comprising quantum dots having ligands, a cross-linked matrix comprising a cross-linkable charge transport material other than the ligands, and another charge transport material,
wherein:
the quantum dots are dispersed in the cross-linked matrix,
the another charge transport material is not cross-linked with the cross-linkable charge transport material in the cross-linked matrix,
the another charge transport material alters mobility of charge carriers of the emissive layer,
the cross-linkable charge transport material is a cross-linkable hole transporting material,
the another charge transport material is an efficient hole transporting material with enhanced or reduced hole transporting properties that improves hole mobility more than the cross-linkable charge transport material, and
in the emissive layer, the quantum dots and the another charge transport material are layer-separated from each other such that the quantum dots are close to the cathode and the another charge transport material is close to the anode.

* * * * *